(12) United States Patent
Wang et al.

(10) Patent No.: US 8,458,544 B2
(45) Date of Patent: *Jun. 4, 2013

(54) MULTIPLE-CAPTURE DFT SYSTEM TO REDUCE PEAK CAPTURE POWER DURING SELF-TEST OR SCAN TEST

(75) Inventors: Laung-Terng Wang, Sunnyvale, CA (US); Hao-Jan Chao, Taoyuan (TW); Shianling Wu, Princeton Junction, NJ (US)

(73) Assignee: Syntest Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/309,987

(22) Filed: Dec. 2, 2011

(65) Prior Publication Data

US 2012/0166903 A1 Jun. 28, 2012

Related U.S. Application Data

(60) Continuation of application No. 12/797,302, filed on Jun. 9, 2010, now Pat. No. 8,091,002, which is a continuation-in-part of application No. 12/222,931, filed on Aug. 20, 2008, now Pat. No. 7,779,323, which is a continuation of application No. 11/806,098, filed on May 30, 2007, now Pat. No. 7,434,126, which is a division of application No. 11/098,703, filed on Apr. 5, 2005, now Pat. No. 7,260,756, which is a division of application No. 10/067,372, filed on Feb. 7, 2002, now Pat. No. 7,007,213.

(60) Provisional application No. 60/268,601, filed on Feb. 15, 2001.

(51) Int. Cl.
*G01R 31/28* (2006.01)
*G06F 17/50* (2006.01)

(52) U.S. Cl.
USPC .................................. 714/731; 703/14

(58) Field of Classification Search
USPC ............. 714/724, 726, 729, 731, 741, 744
See application file for complete search history.

(56) References Cited

U.S. PATENT DOCUMENTS 5,349,587 A 9/1994 Nadeau-Dostie et al.
5,680,543 A 10/1997 Brawmik et al.

(Continued)

FOREIGN PATENT DOCUMENTS

CA 2307 535 11/2000

OTHER PUBLICATIONS

G. Hetherington et al., "Logic BIST form Large Industrial Designs: Real Issues and Case Studies", Proc., IEEE International Test Conf., pp. 358-367, 1999.

(Continued)

*Primary Examiner* — Cynthia Britt
(74) *Attorney, Agent, or Firm* — Bacon & Thomas, PLLC

(57) ABSTRACT

A method for providing ordered capture clocks to detect or locate faults within N clock domains and faults crossing any two clock domains in an integrated circuit or circuit assembly in scan-test or self-test mode, where N>1, includes the steps of: (a) generating and shifting-in N test stimuli to all scan cells within the N clock domains during a shift-in operation; (b) applying an ordered sequence of capture clocks to all scan cells within the N clock domains, the ordered sequence of capture clocks including a plurality of capture clock pulses from two or more selected capture clocks placed in a sequential order such that all clock domains are never triggered simultaneously during a capture operation; and (c) analyzing output responses of all scan cells to locate any faults therein.

6 Claims, 28 Drawing Sheets

U.S. PATENT DOCUMENTS

| | | |
|---|---|---|
| 5,909,451 A | 6/1999 | Lach |
| 5,991,909 A | 11/1999 | Rajski et al. |
| 6,070,260 A | 5/2000 | Buch et al. |
| 6,115,763 A | 9/2000 | Douskey et al. |
| 6,195,776 B1 | 2/2001 | Ruiz et al. |
| 6,327,684 B1 | 12/2001 | Nadeau-Dostie et al. |
| 6,442,722 B1 | 8/2002 | Nadeau-Dostie et al. |
| 6,966,021 B2 | 11/2005 | Rajski et al. |
| 7,007,213 B2 | 2/2006 | Wang et al. |
| 7,434,126 B2 * | 10/2008 | Wang et al. .................. 714/724 |
| 2003/0097614 A1 | 5/2003 | Rajski et al. |

OTHER PUBLICATIONS

Benoit Nadeau-Dostie et a; "Scanbist: A Multifrequency Scan-Based Bist Method", IEEE Design and Test of Computers, IEEE Service Center, New York, NY US, vol. 11, No. 1, pp. 7-17, Mar. 21, 1994.

U.S. Appl. No. 60/089,620, filed Jun. 16, 1998, Hassan et al.

* cited by examiner

US 8,458,544 B2

MULTIPLE-CAPTURE DFT SYSTEM TO REDUCE PEAK CAPTURE POWER DURING SELF-TEST OR SCAN TEST

RELATED APPLICATION DATA

This application is a continuation of U.S. patent application Ser. No. 12/797,302, now allowed, which is a continuation-in-part of U.S. patent application Ser. No. 12/222,931, filed Aug. 20, 2008 and now allowed, which is a continuation of U.S. patent application Ser. No. 11/806,098, filed May 30, 2007 and now U.S. Pat. No. 7,434,126, which is a divisional of U.S. patent application Ser. No. 11/098,703, filed Apr. 5, 2005 and now U.S. Pat. No. 7,260,756, which is a divisional of U.S. patent application Ser. No. 10/067,372, filed Feb. 7, 2002 and now U.S. Pat. No. 7,007,213, which claims the benefit of U.S. Provisional Application No. 60/268,601 filed Feb. 15, 2001, hereby incorporated by reference, and for which priority is claimed for all of the above.

TECHNICAL FIELD

The present invention generally relates to the testing of logic designs in an integrated circuit or circuit assembly embedded with design-for-test (DFT) techniques. Specifically, the present invention relates to the detection or location of logic faults within each clock domain and logic faults crossing any two clock domains, during self-test or scan-test, in an integrated circuit or circuit assembly.

BACKGROUND

In this specification, the term integrated circuit is used to describe a chip or MCM (multi-chip module) embedded with design-for-test (DFT) techniques. The terms circuit assembly and printed circuit board will be considered interchangeable. The term circuit assembly includes printed circuit boards as well as other types of circuit assemblies. A circuit assembly is a combination of integrated circuits. The resulting combination is manufactured to form a physical or functional unit.

An integrated circuit or circuit assembly, in general, contains two or more systems clocks, each controlling one module or logic block, called clock domain. Each system clock is either directly coming from a primary input (edge pin/connector) or generated internally. These system clocks can operate at totally unrelated frequencies (clock speeds), at sub-multiples of each other, at the same frequency but with different clock skews, or at a mix of the above. Due to clock skews among these system clocks, when a DFT technique, such as self-test or scan-test, is employed, it is very likely that faults associated with the function between two clock domains, called crossing clock-domain faults, will become difficult to test. In the worst case, these crossing clock-domain faults when propagating into the receiving clock domain could completely block detection or location of all faults within that clock domain.

Thus, in order to solve the fault propagation problem, DFT approaches are proposed to take over control of all system clocks and reconfigure them as capture clocks.

Prior-art DFT approaches in this area to testing crossing clock-domain faults as well as faults within each clock domain centered on using the isolated DFT, ratio'ed DFT, and one-hot DFT techniques. They are all referred to as single-capture DFT techniques, because none of them can provide multiple skewed capture clocks (or an ordered sequence of capture clocks) in each capture cycle during self-test or scan-test.

In using the isolated DFT technique, all boundary signals crossing a clock domain and flowing into the receiving clock domains are completely blocked or disabled by forcing each of them to a predetermined logic value of 0 or 1. See U.S. Pat. No. 6,327,684 issued to Nadeau-Dostie et al. (2001). This approach, in general, can allow all clock domains to be tested in parallel. The major drawbacks of this approach are that it requires insertion of capture-disabled logic in between clock domains and all scan enable signals each associated with one clock domain must be operated at-speed. The design change could take significant efforts and it might impact normal mode operation. Running all scan enable signals at-speed requires routing them as clock signals using layout clock-tree synthesis (CTS). In addition, since boundary signals can traverse through two clock domains in both directions, this approach requires testing crossing clock-domain faults in two or more test sessions. This could substantially increase the test time required and might make the capture-disabled logic even more complex to implement than anticipated.

In using the ratio'ed DFT technique, all clock domains must be operated at sub-multiples of one reference clock. For instance, assume that a design contains 3 clock domains running at 150 MHz, 80 MHz, and 45 MHz, respectively. The 3 clock domains may have to be operated at 150 MHz, 75 MHz, and 37.5 MHz during testing. See U.S. Pat. No. 5,349,587 issued to Nadeau-Dostie et al. (1994). This approach reduces the complexity of testing a multiple-frequency design and avoids potential races or timing violations crossing clock domains. It can also allow testing of all clock domains in parallel. However, due to changes in clock-domain operating frequencies, this approach loses its self-test or scan-test intent of testing multiple-frequency designs at their rated clock speeds (at-speed) and may require significant design and layout efforts on re-timing (or synchronizing) all clock domains. Power consumption could be also another serious problem because all scan cells (memory elements) are triggered simultaneously every few cycles.

In using the one-hot DFT technique, each crossing clock-domain signal flowing into its receiving clock domains must be initialized to or held at a predetermined logic value of 0 or 1 first. This initialization is usually accomplished by shifting in predetermined logic values to all clock domains so that all crossing clock-domain signals are forced to a known state. Testing is then conducted domain-by-domain, thus, called one-hot testing. See U.S. Pat. No. 5,680,543 issued to Bhawmik et al. (1997). The major benefits of using this approach are that it can still detect or locate crossing clock-domain faults and does not need insertion of disabled logic, in particular, in critical paths crossing clock domains. However, unlike the isolated or ratio'ed DFT approach, this approach requires testing of all clock domains in series, resulting in long test time. It also requires significant design and layout efforts on re-timing (or synchronizing) all clock domains.

Two additional prior-art DFT approaches had also been proposed, one for scan-test, the other for self-test. Both approaches are referred to as multiple-capture DFT techniques, because they can provide multiple skewed capture clocks (or an ordered sequence of capture clocks) in each capture cycle during scan-test or self-test.

The first prior-art multiple-capture DFT approach is to test faults within each clock domain and faults between two clock domains in scan-test mode. See U.S. Pat. No. 6,070,260 issued to Buch et al. (2000) and U.S. Pat. No. 6,195,776 issued to Ruiz et al. (2001). These approaches rest on using multiple skewed scan clocks or multiple skew capture events each operating at the same reduced clock speed in an ATE (automatic test equipment) to detect faults. Combinational ATPG (automatic test pattern generation) is used to generate scan-test patterns and ATE test programs are created to detect faults in the integrated circuit. Unfortunately, currently available ATPG tools only assume the application of one clock pulse (clock cycle) to each clock domain. Thus, these approaches can only detect stuck-at faults in scan-test mode. No prior art using multiple skewed capture clocks were proposed to test delay or stuck-at faults requiring two or more capture clock pulses for full-scan or partial-scan designs.

The second prior-art multiple-capture DFT approach is to test faults within each clock domain and faults between two clock domains in self-test mode. See the paper co-authored by Hetherington et al. (1999). This approach rests on using multiple shift-followed-by-capture clocks each operating at its operating frequency, in a programmable capture window, to detect faults at-speed. It requires clock suppression, complex scan enable (SE) timing waveforms, and shift clock pulses in the capture window to control the capture operation. These shift clock pulses may also need precise timing alignment. As a result, it becomes quite difficult to perform at-speed self-test for designs containing clock domains operated at totally unrelated frequencies, e.g., 133 MHz and 60 MHz.

Thus, there is a need for an improved method, apparatus, or computer-aided design (CAD) system that allows at-speed or slow-speed testing of faults within clock domains and between any two clock domains using a simple multiple-capture DFT technique. The method and apparatus of the present invention will control the multiple-capture operations of the capture clocks in self-test or scan-test mode. It does not require using shift clock pulses in the capture window, inserting capture-disabled logic in normal mode, applying clock suppression on capture clock pulses, and programming complex timing waveforms on scan enable (SE) signals. In addition, the CAD system of the present invention further comprises the computer-implemented steps of performing multiple-capture self-test or scan synthesis, combinational fault simulation, and combinational ATPG that are currently unavailable in the CAD field using multiple-capture DFT techniques.

In light of the prevalent yield loss problem caused by high peak capture power in self-test or scan-test mode, the present invention further comprises methods for capture-power reduction. It also supports scan-chain integrity verification in self-test mode.

SUMMARY

Accordingly, a primary objective of the present invention is to provide an improved multiple-capture DFT system implementing the multiple-capture DFT technique. Such a DFT system will comprise a method or apparatus for allowing at-speed/slow-speed detection or location of faults within all clock domains and faults crossing clock domains in an integrated circuit or circuit assembly. In the present invention, the method or apparatus can be realized and placed inside or external to the integrated circuit or circuit assembly.

A computer-aided design (CAD) system that synthesizes such a DFT system and generates desired HDL test benches and ATE test programs is also included in the present invention. A hardware description language (HDL) is used to represent the integrated circuit includes, but is not limited to, Verilog or VHDL. An ATE is an IC tester or any equipment that realizes the multiple-capture DFT system and is external to the integrated circuit or circuit assembly under test.

The present invention focuses on multiple-capture DFT systems for self-test and scan-test. In a self-test environment, a self-test cycle often comprises 3 major operations: shift, capture, and compact. The shift and compact operations can occur concurrently during each self-test cycle. In order to increase the circuit's fault coverage, it is often necessary to include scan-test cycles to perform top-up ATPG. A scan-test cycle often comprises 3 major operations in a scan-test environment: shift, capture, and compare. The shift and compare operations can occur concurrently during each scan-test cycle. In a mixed self-test and scan-test environment, the scan-test cycle may execute a compact operation rather than the compare operation. Thus, in the present invention, a self-test cycle further comprises the shift, capture, and compare operations, and a scan-test cycle further comprises the shift, capture, and compact operations.

The multiple-capture DFT system of the present invention further comprises any method or apparatus for executing the shift and compact or shift and compare operations concurrently during each self-test or scan-test cycle. It is applicable to test any integrated circuit or circuit assembly which contains N clock domains, where N>1. Each capture clock controls one clock domain and can operate at its rated clock speed (at-speed) or at a reduced clock speed (slow-speed), when desired.

During the shift operation, the multiple-capture DFT system first generates and shifts in (loads) N pseudorandom or predetermined stimuli to all scan cells within all clock domains, concurrently. The shifting frequency is irrelevant to at-speed testing. Depending on needs, a slower frequency can be used to reduce power consumption and a faster frequency can be used to reduce the test application time. The multiple-capture DFT system must wait until all stimuli have been loaded or shifted into all scan cells. By that time, all scan enable (SE) signals each associated with one clock domain shall switch from the shift operation to the capture operation. After the capture operation is completed, all scan enable (SE) signals shall switch from the capture operation to the shift operation. One global scan enable (GSE) signal can be simply used to drive these scan enable signals.

The multiple-capture DFT system of the present invention further comprises any method or apparatus for performing the shift operation at any selected clock speed within each clock domain and using only one global scan enable (GSE) signal to drive all scan enable (SE) signals for at-speed or slow-speed testing. The GSE signal can be also operated at its selected reduced clock speed. Thus, there is no need to route these SE signals as clock signals using layout clock tree synthesis (CTS). This invention applies to any self-test or scan-test method that requires multiple capture clock pulses (without including shift clock pulses) in the capture cycle.

After the shift operation is completed, an ordered sequence of capture clocks is applied to all clock domains. During the capture operation, each ordered sequence contains N capture clocks of which one or a few will be active at one time. There are no shift clock pulses present within each capture cycle. Testing of delay faults at-speed is now performed by applying two consecutive capture clock pulses (double captures) rather than using the shift-followed-by-capture clock pulses. Performing multiple captures in the capture cycle reduces the risk of delay test invalidation and false paths that might occur due to illegal states in scan cells resulting from filling them with pseudorandom or predetermined stimuli.

In the present invention, the multiple-capture DFT system uses a daisy-chain clock-triggering or token-ring clock-enabling technique to generate and order capture clocks one after the other. One major benefit of using this approach is that the test results are repeatable no matter what clock speed will be used for each capture clock. The problem is it could be difficult to precisely control the relative clock delay between two adjacent capture clocks for testing delay faults between clock domains.

As an example, assume that the capture cycle contains 4 capture clocks, CK1, CK2, CK3, and CK4. (Please refer to FIGS. 3 and 10 in the DETAILED DESCRIPTION OF THE DRAWINGS section for further descriptions). The daisy-chain clock-triggering technique implies that completion of the shift cycle triggers the GSE signal to switch from shift to capture cycle which in turn triggers CK1, the rising edge of the last CK1 pulse triggers CK2, the rising edge of the last CK2 pulse triggers CK3, and the rising edge of the last CK3 pulse triggers CK4. Finally, the rising edge of the last CK4 pulse triggers the GSE signal to switch from capture to shift cycle.

The token-ring clock-enabling technique implies that completion of the shift cycle enables the GSE signal to switch from shift to capture cycle which in turn enables CK1, completion of CK1 pulses enables CK2, completion of CK2 pulses enables CK3, and completion of CK3 pulses enables CK4. Finally, completion of CK4 pulses enables the GSE signal to switch from capture to shift cycle.

The only difference between these two techniques is that the former uses clock edges to trigger the next operation, the latter uses signal levels to enable the next operation. In practice, a mixed approach can be employed. Since a daisy-chain or token-ring approach is used, the multiple-capture DFT system allows testing of any frequency domain at a reduced clock speed when this particular frequency domain cannot operate at-speed. This is very common in testing high-speed integrated circuits, such as microprocessors and networking chips, where different clock speeds of chips are sold at different prices. In addition, due to its ease of control, this approach further allows at-speed scan-test simply using internally reconfigured capture clocks. Thus, a low-cost tester (ATE) can be used for at-speed scan-test, in addition to at-speed self-test.

The multiple-capture DFT system in the present invention further comprises applying an ordered sequence of capture clocks and operating each capture clock at its selected clock speed in the capture operation (cycle). The ordered sequence of capture clocks is applied to the circuit under test one-by-one using the daisy-chain clock-triggering or token-ring clock-enabling technique. The order of these capture clocks is further programmable, when it's required to increase the circuit's fault coverage. Each capture clock can be also disabled or chosen to facilitate fault diagnosis. In addition, when two clock domains do not interact with each other, they can be tested simultaneously to shorten the capture cycle time.

Each capture clock of the present invention further comprises one or more clock pulses. The number of clock pulses is further programmable. When self-test is employed, the multiple-capture DFT system is usually placed inside the integrated circuit and, thus, all capture clocks are generated internally. When scan-test is employed, the multiple-capture DFT system is usually resided in an ATE and, thus, all capture clocks are controlled externally. However, for at-speed scan-test, it's often required to capture output responses using its respective operating frequency within each clock domain. The present invention further comprises any method or apparatus for allowing use of internally-generated or externally-controlled capture clocks for at-speed scan-test or self-test.

After the capture operation is completed, all output responses captured at all scan cells are compacted internally to signatures or shifted out to the multiple-capture DFT system for direct comparison. The compact or compare operation occurs concurrently with the shift operation, and the process of shift, capture, and compact/compare operations shall continue until a predetermined limiting criteria, such as completion of all self-test or scan-test cycles, is reached. Finally, the multiple-capture DFT system will compare the signatures against expected signatures when the compact operation is employed during self-test or scan-test. Such comparison can be done either in the integrated circuit with a built-in comparator or in an ATE by shifting the final signatures out for analysis.

In the present invention, both self-test and scan-test techniques are employed to detect or locate stuck-at and delay faults. The stuck-at faults further comprise other stuck-type faults, such as open and bridging faults. The delay faults further comprise other non-stuck-type delay faults, such as transition (gate-delay), multiple-cycle delay, and path-delay faults. In addition, each scan cell can be a multiplexed D flip-flop or a level sensitive latch, and the integrated circuit or circuit assembly under test can be a full-scan or partial-scan design.

In general, it is only required to apply one clock pulse and two consecutive clock pulses to test stuck-at faults and delay faults within one clock domain, respectively. Multiple-cycle paths present within one clock domain and between clock domains, however, require waiting for a number of clock cycles for capturing. To test multiple-cycle paths within clock domains, the present invention further comprise applying only one clock pulse to test these multiple-cycle paths within each clock domain by reducing the frequency of that domain's capture clock speed to the level where only paths of equal cycle latency (cycle delays) are captured at its intended rated clock speed one at a time. To test multiple-cycle paths between two clock domains, the present invention further comprise adjusting the relative clock delay along the paths to the level where the crossing-boundary multiple-cycle paths are captured at its intended rated clock speed.

High peak capture power results in IR-drop, which causes a yield loss problem. To avoid this problem, the multiple-capture DFT system in the present invention comprises applying one capture clock pulse for all clock domains in the capture operation, or applying two or more capture clock pulses for one clock domain at a time in the capture operation in self-test mode. The present invention further comprises a method of verifying scan-chain integrity in self-test mode by applying no capture clock pulse during the capture operation.

To summarize, the present invention centers on using one global scan enable (GSE) signal for driving all scan enable (SE) signals at a reduced clock speed and applying an ordered sequence of capture clocks for capturing output responses in both self-test and scan-test modes. The present invention assumes that the integrated circuit or circuit assembly must contain two or more clock domains each controlled by one capture clock. During self-test, each capture clock shall contain one or more clock pulses, and during scan-test, one of the capture clocks must contain two or more clock pulses.

Due to its ease of control on the scan enable and capture clock signals, the multiple-capture DFT system of the present invention can now be easily realized by an apparatus and synthesized using computer-aided design (CAD) tools. The present invention further comprises such a CAD system for synthesizing the apparatus and verifying its correctness using combinational fault simulation and combinational ATPG in self-test or scan-test mode.

BRIEF DESCRIPTION OF THE DRAWINGS

The above and other objects, advantages and features of the invention will become more apparent when considered with the following specification and accompanying drawings wherein.

DETAILED DESCRIPTION OF THE DRAWINGS

The following description is of presently contemplated as the best mode of carrying out the present invention. This description is not to be taken in a limiting sense but is made merely for the purpose of describing the principles of the invention. The scope of the invention should be determined by referring to the appended claims.

Figure 1:
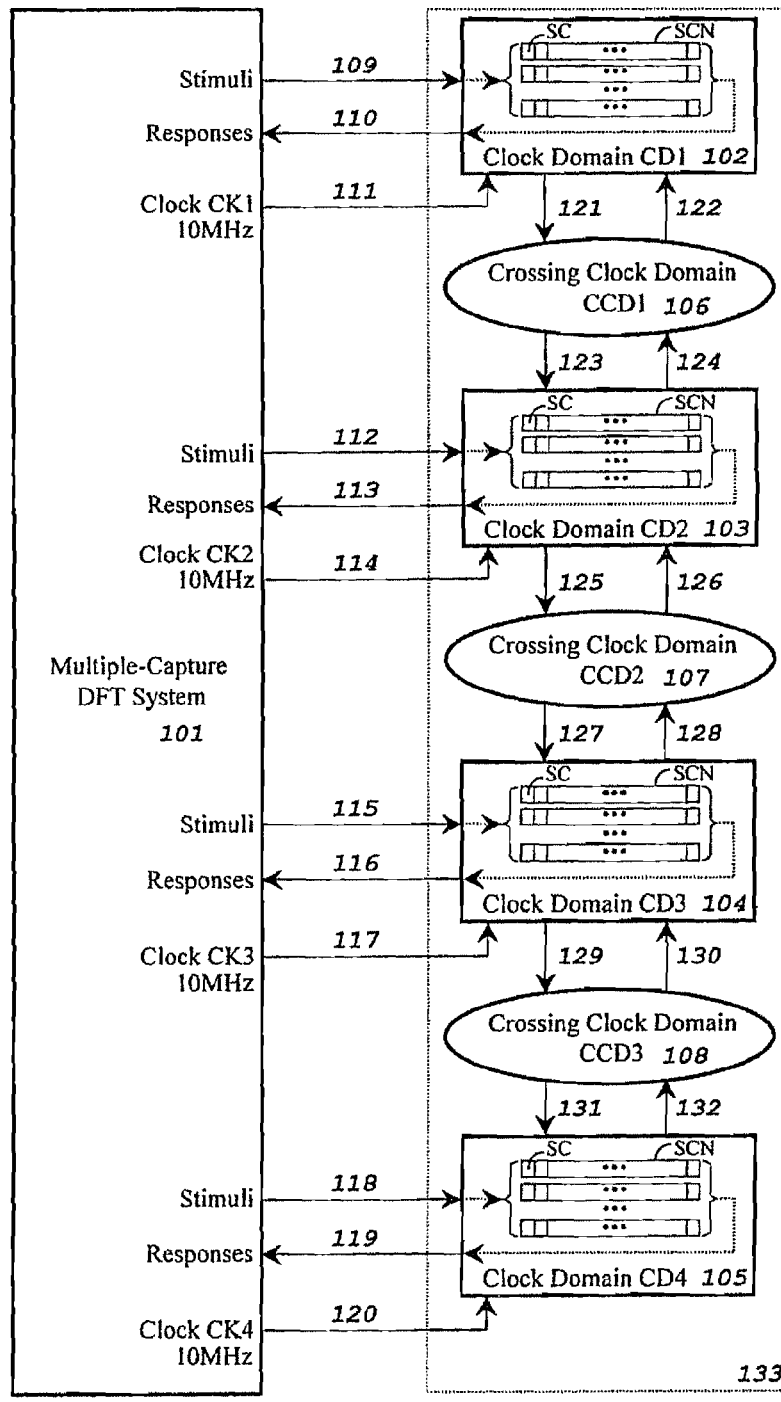
FIG. 1 shows an example full-scan or partial-scan design with 4 clock domains and 4 system clocks, where a multiple-capture DFT system in accordance with the present invention is used to detect or locate stuck-at faults at a reduced clock speed in self-test or scan-test mode.

FIG. 1 shows an example full-scan or partial-scan design with a multiple-capture DFT system, of one embodiment of the invention. The design 133 contains 4 clock domains, CD1 102 to CD4 105, and 4 system clocks, CK1 111 to CK4 120. Each system clock controls one clock domain. CD1 102 and CD2 103 talk to each other via a crossing clock-domain logic block CCD1 106; CD2 103 and CD3 104 talk to each other via a crossing clock-domain logic block CCD2 107; and CD3 104 and CD4 105 talk to each other via a crossing clock-domain logic block CCD3 108.

The 4 clock domains, CD1 102 to CD4 105, are originally designed to run at 150 MHz, 100 MHz, 100 MHz, and 66 MHz, respectively. However, in this example, since a DFT (self-test or scan-test) technique is only employed to detect or locate stuck-at faults in the design 133, all system clocks, CK1 111 to CK4 120, are reconfigured to operate at 10 MHz. The reconfigured system clocks are called capture clocks.

During self-test or scan-test, the multiple-capture DFT system 101 will take over the control of all stimuli, 109, 112, 115, and 118, all system clocks, CK1 111 to CK4 120, and all output responses, 110, 113, 116, and 119.

During the shift operation, the multiple-capture DFT system 101 first generates and shifts pseudorandom or predetermined stimuli through 109, 112, 115, and 118 to all scan cells SC in all scan chains SCN within the 4 clock domains, CD1 102 to CD4 105, simultaneously. The multiple-capture DFT system 101 shall wait until all stimuli, 109, 112, 115, and 118, have been shifted into all scan cells SC. It should be noted that, during the shift operation, the capture clock can be operated either at its rated clock speed (at-speed) or at a desired clock speed.

After the shift operation is completed, an ordered sequence of capture clocks is applied to all clock domains, CD1 102 to CD4 105. During the capture operation, each capture clock can operate at its rated clock speed (at-speed) or at a reduced speed (slow-speed), and can be generated internally or controlled externally. In this example, all system clocks, CK1 111 to CK4 120, are reconfigured to operate at a reduced frequency of 10 MHz.

After the capture operation is completed, the output responses captured at all scan cells SC are shifted out through responses 110, 113, 116, and 119 to the multiple-capture DFT system 101 for compaction during the compact operation or direct comparison during the compare operation.

Based on FIG. 1, the timing diagrams given in FIGS. 3 to 6 are used to illustrate that, by properly ordering the sequence of capture clocks and by adjusting relative inter-clock delays, stuck-at faults within each clock domain and crossing clock domains can be detected or located in self-test or scan-test mode. Please note that different ways of ordering the sequence of capture clocks and adjusting relative inter-clock delays will result in different faults to be detected or located.

Figure 2:
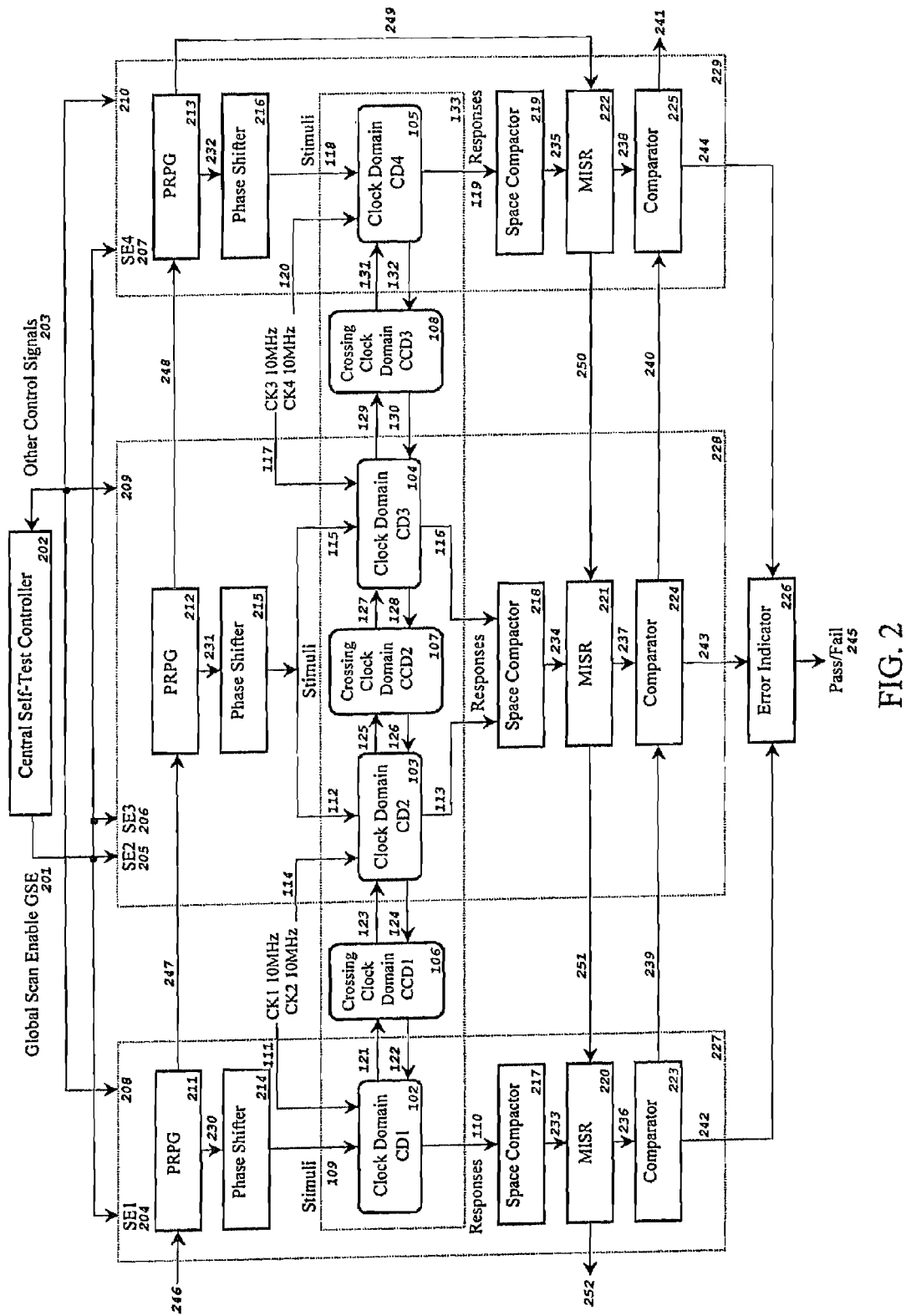
FIG. 2 shows a multiple-capture DFT system with multiple PRPG-MISR pairs, in accordance with the present invention, which is used at a reduced clock speed in self-test mode to detect or locate stuck-at faults in the design given in FIG. 1.

FIG. 2 shows a multiple-capture DFT system with three PRPG-MISR pairs, of one embodiment of the invention, used to detect or locate stuck-at faults in the design 133 given in FIG. 1 in self-test mode.

Pseudorandom pattern generators (PRPGs), 211 to 213, are used to generate pseudorandom patterns. Phase shifters, 214 to 216, are used to break the dependency between different outputs of the PRPGs. The bit streams coming from the phase shifters become test stimuli, 109, 112, 115, and 118.

Space compactors, 217 to 219, are used to reduce the number of bit streams in test responses, 110, 113, 116, and 119. Space compactors are optional and are only used when the overhead of a MISR becomes a concern. The outputs of the space compactors are then compressed by multiple input signature registers (MISRs), 220 to 222. The contents of MISRs after all test stimuli are applied become signatures, 236 to 238. The signatures are then be compared by comparators, 223 to 225, with corresponding expected values. The error indicator 226 is used to combine the individual pass/fail signals, 242 to 244, a global pass/fail signal 245. Alternatively, the signatures in MISRs 220 to 222 can be shifted to the outside of the design for comparison through a single scan chain composed of elements 223, 239, 224, 240, 225, and 241.

The central self-test controller 202 controls the whole test process by manipulating individual scan enable signals, 204 to 207, and by reconfiguring capture clocks, CK1 111 to CK4 120. Especially, the scan enable signals, 204 to 207, can be controlled by one global scan enable signal GSE 201, which can be a slow signal in that it does not have to settle down in half of the cycle of any clock applied to any clock domain. Some additional control signals 203 are needed to conduct other control tasks.

The clock domains 103 and 104, which are operated at the same frequency, share the same pair of PRPG 212 and MISR 221. It should be noted that the skew between the clocks CK2 114 and CK3 117 should be properly managed to prevent any timing violations during the shift operation and any races during the capture operation.

All storage elements in PRPGs, 211 to 213, and MISRs, 220 to 222, can be connected into a scan chain from which predetermined patterns can be shifted in for reseeding and computed signatures can be shifted out for analysis. This configuration helps in increasing fault coverage and in facilitating fault diagnosis.

Figure 3:
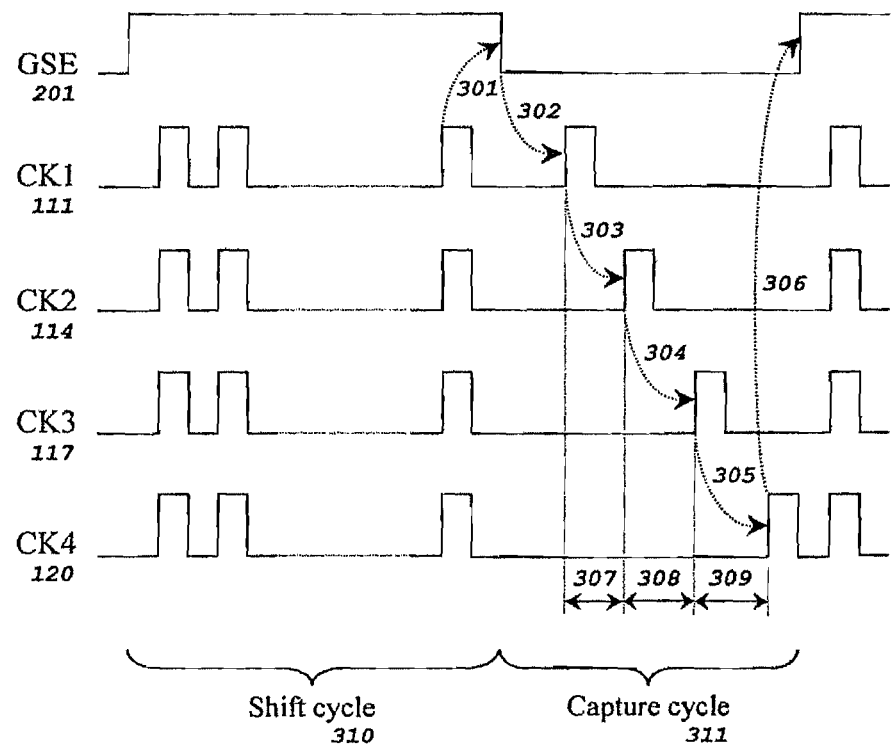
FIG. 3 shows a timing diagram of the full-scan design given in FIG. 1, in accordance with the present invention, where an ordered sequence of capture clocks is used to detect or locate stuck-at faults within each clock domain and stuck-at faults crossing clock domains in self-test mode. The chain of control events is also shown.

FIG. 3 shows a timing diagram of a full-scan design given in FIG. 1, of one embodiment of the invention for detecting or locating stuck-at faults within each clock domain and stuck-at faults crossing clock domains with an ordered sequence of capture clocks in self-test mode. The timing diagram 300 shows the sequence of waveforms of the 4 capture clocks, CK1 111 to CK4 120, operating at the same frequency.

During each shift cycle 310, a series of pulses of 10 MHz are applied through capture clocks, CK1 111 to CK4 120, to shift stimuli to all scan cells within all clock domains, CD1 102 to CD4 105.

During each capture cycle 311, 4 sets of capture clock pulses are applied in the following order: First, one capture pulse is applied to CK1 111 to detect or locate stuck-at faults within the clock domain CD1 102. Second, one capture pulse is applied to CK2 114 to detect or locate stuck-at faults within the clock domain CD2 103. Third, one capture pulse is applied to CK3 117 to detect or locate stuck-at faults within the clock domain CD3 104. Fourth, one capture pulse is applied to CK4 120 to detect or locate stuck-at faults within the clock domain CD4 105.

In addition, the stuck-at faults which can be reached from lines 121, 125, and 129 in the crossing clock-domain logic blocks CCD1 106 to CCD3 108, respectively, are also detected or located simultaneously if the following condition is satisfied: The relative clock delay 307 between the rising edge of the capture pulse of CK1 111 and the rising edge of the capture pulse of CK2 114 must be adjusted so that no races or timing violations would occur while the output responses 123 are captured through the crossing clock-domain logic block CCD1 106.

The same principle applies to the relative clock delay 308 between CK2 114 and CK3 117, and the relative clock delay 309 between CK3 117 and CK4 120 for capturing output responses, 127 and 131, through CCD2 107 and CCD3 108, respectively.

It should be noticed that, generally, during each shift cycle, any capture clock is allowed to operate at its desired or a reduced clock speed. In addition, it is not necessary that all capture clocks must operate at the same clock speed. Furthermore, to reduce peak power consumption during the shift cycle, all capture clocks can be skewed so that at any given time only scan cells within one clock domain can change states. One global scan enable signal GSE 201, operated at a reduced clock speed, can also be used, when requested, to switch the test operation from the shift cycle to the capture cycle, and vice versa.

The daisy-chain clock-triggering technique is used to generate and order the sequence of capture clocks one after the other in the following way: The rising edge of the last pulse in the shift cycle triggers the event 301 of applying 0 to the global scan enable GSE 201, switching the test operation from the shift cycle to the capture cycle. The falling edge of GSE 201 triggers the event 302 of applying one capture pulse to CK1 111. Similarly, the rising edge of the capture pulse of CK1 111 triggers the event 303 of applying one capture pulse to CK2 114, the rising edge of the capture pulse of CK2 114 triggers the event 304 of applying one capture pulse to CK3 117, and the rising edge of the capture pulse of CK3 117 triggers the event 305 of applying one capture pulse to CK4 120. Finally, the rising edge of the capture pulse of CK4 120 triggers the event 306 of applying 1 to the global scan enable GSE 201, switching the test operation from the capture cycle to the shift cycle. This daisy-chain clock-triggering technique is also used to order the sequence of capture clocks in FIGS. 4 to 6.

Figure 4:
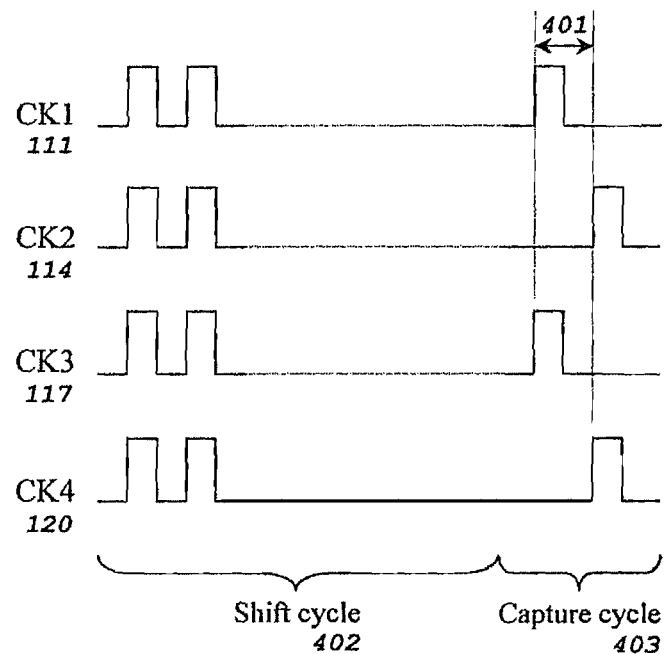
FIG. 4 shows a timing diagram of the full-scan design given in FIG. 1, in accordance with the present invention, where a shortened yet ordered sequence of capture clocks is used to detect or locate stuck-at faults within each clock domain and stuck-at faults crossing clock domains in self-test mode.

FIG. 4 shows a timing diagram of a full-scan design given in FIG. 1, of one embodiment of the invention for detecting or locating stuck-at faults within each clock domain and stuck-at faults crossing clock domains with a shortened yet ordered sequence of capture clocks in self-test mode. The timing diagram 400 shows the sequence of waveforms of the 4 capture clocks, CK1 111 to CK4 120, operating at the same frequency.

During each shift cycle 402, a series of clock pulses of 10 MHz are applied through capture clocks, CK1 111 to CK4 120, to shift stimuli to all scan cells within all clock domains, CD1 102 to CD4 105.

During each capture cycle 403, two sets of capture clock pulses are applied in the following order: First, one capture pulse is applied to CK1 111 and CK3 117 simultaneously to detect or locate stuck-at faults within the clock domain CD1 102 and CD3 104, respectively. Second, one capture pulse is applied to CK2 114 and CK4 120 simultaneously to detect or locate stuck-at faults within the clock domain CD2 103 and CD4 105, respectively.

In addition, the stuck-at faults which can be reached from lines 121, 128, and 129 in the crossing clock-domain logic blocks CCD1 106 to CCD3 108, respectively, are also detected or located simultaneously if the following condition is satisfied: The relative clock delay 401 between the rising edge of the capture pulse for CK1 111 and CK3 117 and the rising edge of the capture pulse for CK2 114 and CK4 120, must be adjusted so that no races or timing violations would occur while the output responses, 123, 126, and 131, are captured through the crossing clock-domain logic blocks CCD1 106 to CCD3 108.

Figure 5:
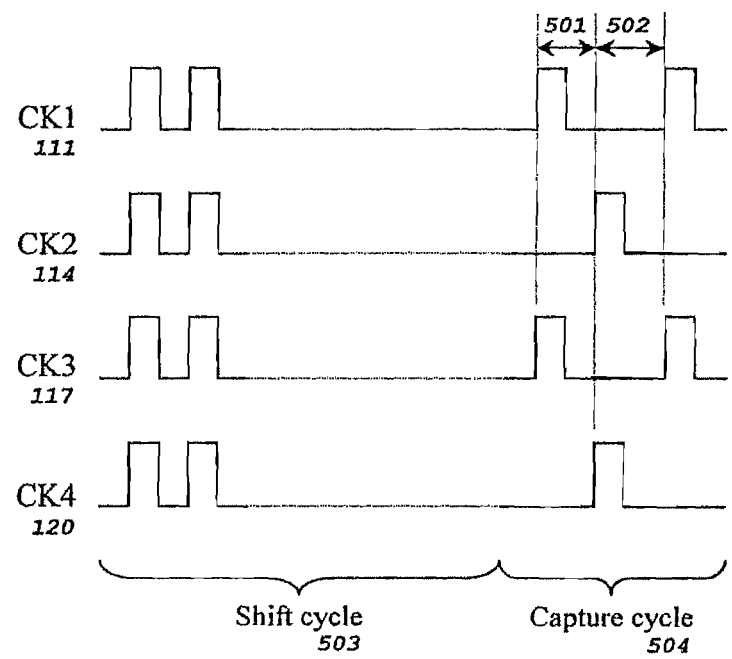
FIG. 5 shows a timing diagram of the full-scan design given in FIG. 1, in accordance with the present invention, where an expanded yet ordered sequence of capture clocks is used to detect or locate other stuck-type faults within each clock domain and other stuck-type faults crossing clock domains in self-test or scan-test mode.

FIG. 5 shows a timing diagram of a full-scan design in FIG. 1 of one embodiment of the invention for detecting or locating other stuck-type faults within each clock domain and other stuck-type faults crossing clock domains with an expanded yet ordered sequence of capture clocks in self-test or scan-test mode. The timing diagram 500 shows the sequence of waveforms of the 4 capture clocks, CK1 111 to CK4 120, operating at the same frequency.

During each shift cycle 503, a series of clock pulses of 10 MHz are applied through capture clocks, CK1 111 to CK4 120, to shift stimuli to all scan cells within all clock domains, CD1 102 to CD4 105.

During each capture cycle 504, two sets of capture clock pulses are applied in the following order: First, two capture pulses are applied to CK1 111 and CK3 117, simultaneously. Second, one capture pulse is applied to CK2 114 and CK4 120, simultaneously. Stuck-at faults in all crossing clock-domain combinations, from 121 to 123, from 124 to 122, from 125 to 127, from 128 to 126, from 129 to 131, from 132 to 130, can be detected or located if the following condition is satisfied: The relative clock delay 501 between the rising edge of the first capture pulse of CK1 111 and CK3 117 and the rising edge of the capture pulse of CK2 114 and CK4 120 must be adjusted so that no races or timing violations would occur while the output responses 123, 126, and 131 are captured through the crossing clock-domain logic block CCD1 106 to CCD3 108, respectively. The relative clock delay 502 between the rising edge of the capture pulse of CK2 114 and CK4 120 and the second capture pulse of CK1 111 and CK3 117 must be adjusted so that no races or timing violations would occur while the output responses 122, 127, and 130 are captured through the crossing clock-domain logic block CCD1 106 to CCD3 108, respectively.

Figure 6:
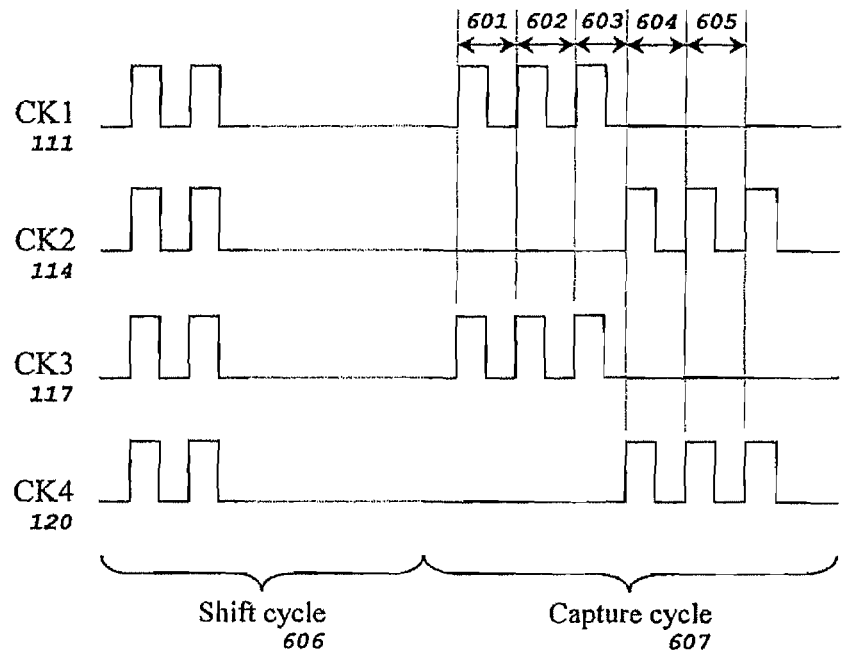
FIG. 6 shows a timing diagram of the partial-scan design given in FIG. 1, in accordance with the present invention, where an ordered sequence of capture clocks is used to detect or locate stuck-at faults within each clock domain and stuck-at faults crossing clock domains in self-test or scan-test mode.

FIG. 6 shows a timing diagram of a feed-forward partial-scan design given in FIG. 1, of one embodiment of the invention for detecting or locating stuck-at faults within each clock domain and stuck-at faults crossing clock domains with a shortened yet ordered sequence of capture clocks in self-test or scan-test mode. It is assumed that the clock domains CD1 102 to CD4 105 contain a number of un-scanned storage cells that form a sequential depth of no more than 2. The timing diagram 600 shows the sequence of waveforms of the 4 capture clocks, CK1 111 to CK4 120, operating at the same frequency.

During each shift cycle 606, a series of clock pulses of 10 MHz are applied through capture clocks, CK1 111 to CK4 120, to shift stimuli to all scan cells within all clock domains, CD1 102 to CD4 105.

During each capture cycle 607, two sets of capture clock pulses are applied in the following order: First, three pulses of 10 MHz, two being functional pulses and one being a capture pulse, are applied to CK1 111 and CK3 117 simultaneously to detect or locate stuck-at faults within the clock domain CD1 102 and CD3 104, respectively. Second, three pulses of 10 MHz, two being functional pulses and one being a capture pulse, are applied to CK2 114 and CK4 120 simultaneously to detect or locate stuck-at faults within the clock domain CD2 103 and CD4 105, respectively.

In addition, the stuck-at faults which can be reached from lines 121, 128, and 129 in the crossing clock-domain logic blocks CCD1 106 to CCD3 108, respectively, are also detected or located simultaneously if the following condition is satisfied: The relative clock delay 603 between the rising edge of the capture pulse for CK1 111 and CK3 117 and the rising edge of the capture pulse for CK2 114 and CK4 120 must be adjusted so that no races or timing violations would occur while the output responses, 123, 126, and 131, are captured through the crossing clock-domain logic blocks CCD1 106 to CCD3 108.

Figure 7:
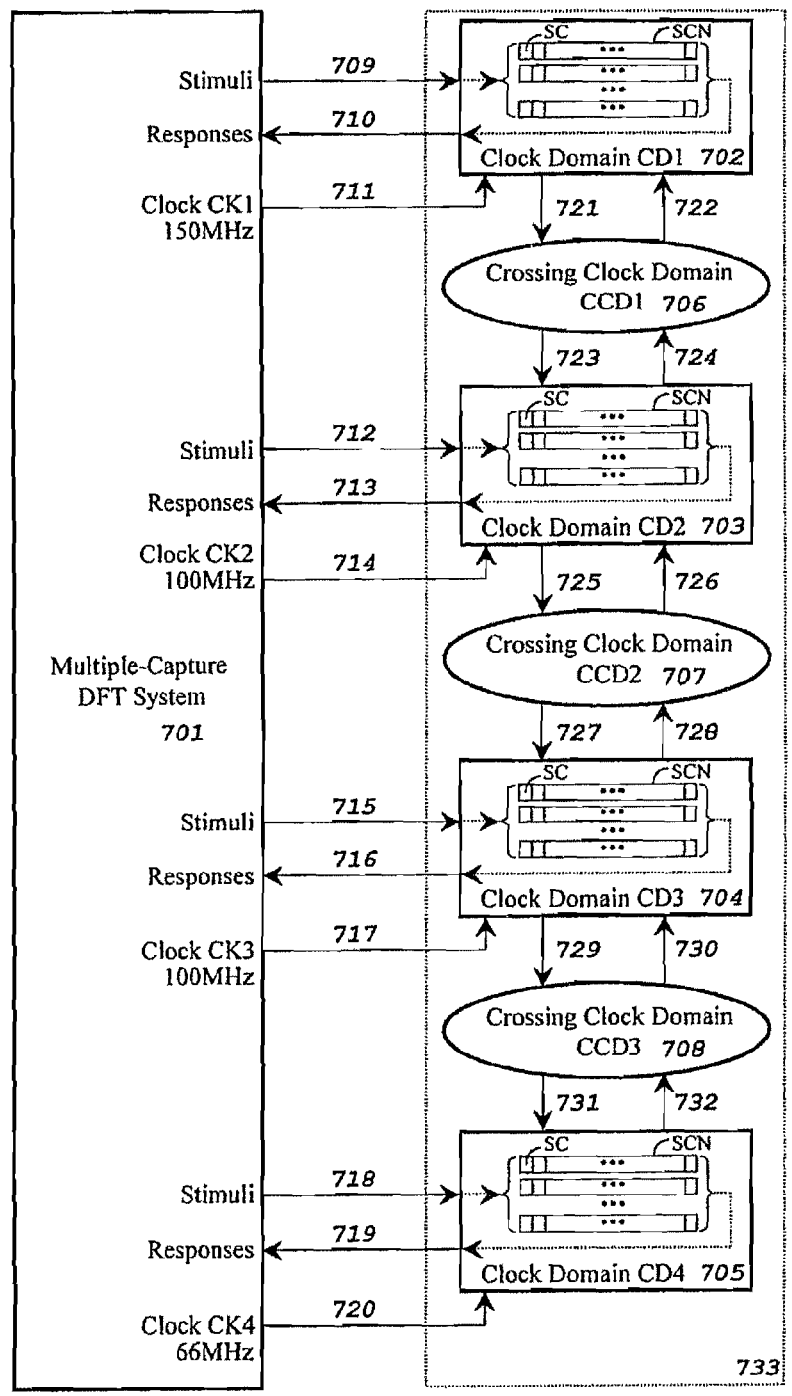
FIG. 7 shows an example full-scan or partial-scan design with 4 clock domains and 4 system clocks, where a multiple-capture DFT system in accordance with the present invention is used to detect or locate stuck-at, delay, and multiple-cycle delay faults at its desired clock speed in self-test or scan-test mode.

FIG. 7 shows an example full-scan or partial-scan design with a multiple-capture DFT system, of one embodiment of the invention. The design 733 is the same as the design 133 given in FIG. 1. Same as in FIG. 1, the 4 clock domains, CD1 702 to CD4 705, are originally designed to run at 150 MHz, 100 MHz, 100 MHz, and 66 MHz, respectively. The only difference from FIG. 1 is that these clock frequencies will be used directly without alternation in order to implement at-speed self-test or scan-test for stuck-at, delay, and multiple-cycle delay faults within each clock domain and crossing clock domains.

Based on FIG. 7, the timing diagrams given in FIGS. 9 to 20 are used to illustrate that, by properly ordering the sequence of capture pulses and by adjusting relative inter-clock delays, the at-speed detection or location of stuck-at, delay, and multiple-cycle delay faults within each clock domain and crossing clock domains can be achieved in self-test or scan-test mode. Please note that different ways of ordering the sequence of capture pulses and adjusting relative inter-clock delays will result in different faults to be detected or located.

Figure 8:
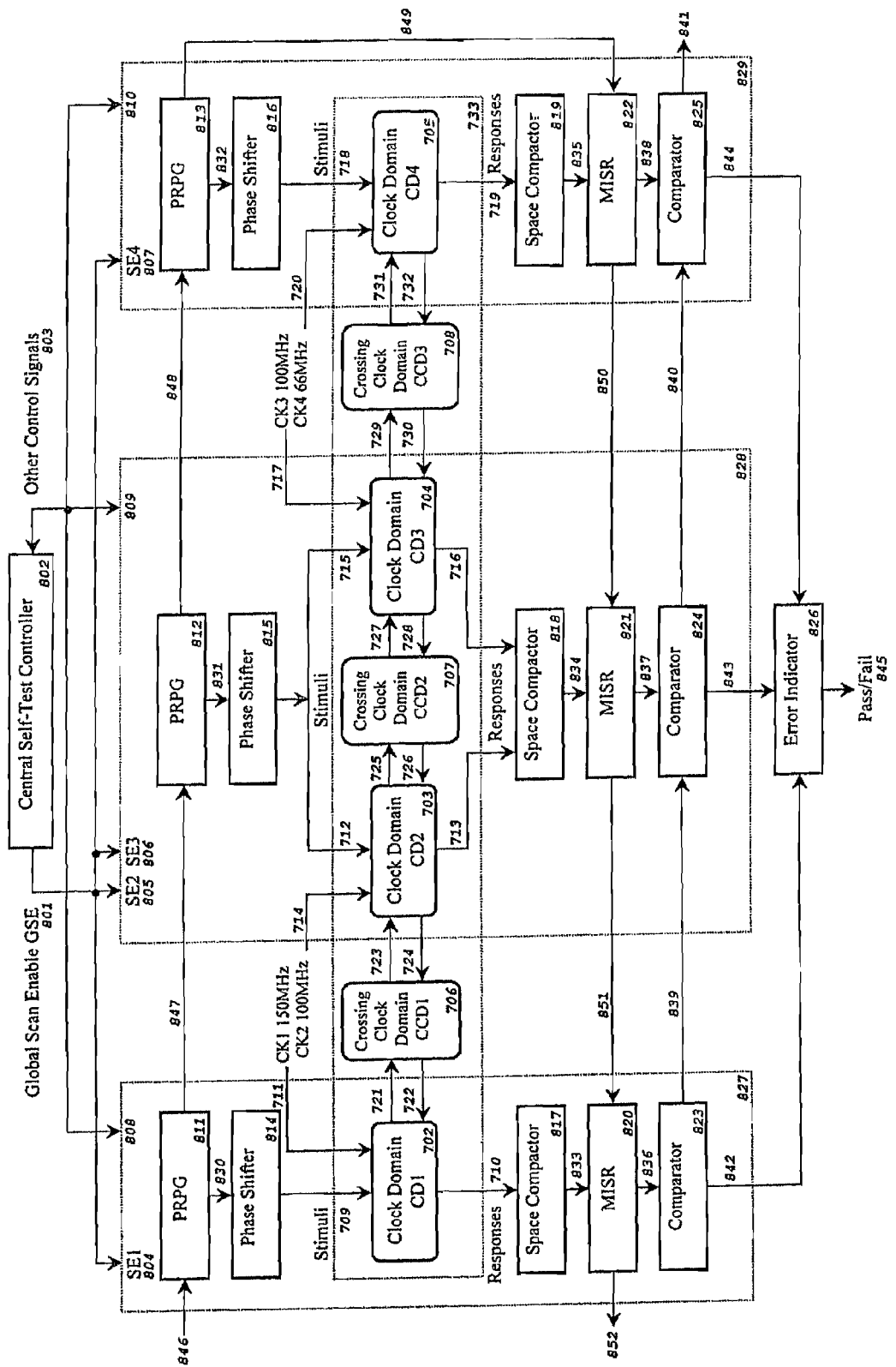
FIG. 8 shows a multiple-capture DFT system with multiple PRPG-MISR pairs, in accordance with the present invention, which is used at its desired clock speed in self-test or scan-test mode to detect or locate stuck-at, delay, and multiple-cycle delay faults in the design given in FIG. 7.

FIG. 8 shows a multiple-capture DFT system with three PRPG-MISR pairs, of one embodiment of the invention, used in self-test or scan-test mode to detect or locate stuck-at, delay, and multiple-cycle delay faults in the design given in FIG. 7. The composition and operation of the multiple-capture DFT system is basically the same as the one given in FIG. 2. There are two major differences: One is that, in this example, the original clock frequencies, 150 MHz, 100 MHz, 100 MHz, and 66 MHz, are used directly without alternation in order to implement at-speed self-test or scan-test. The other is that more care needs to be taken in the physical design of scan chains, etc., in this example.

The clock domains 703 and 704, which are operated at the same frequency, share the same pair of PRPG 812 and MISR 821. It should be noted that the skew between the clocks CK2 714 and CK3 717 should be properly managed to prevent any timing violations during the shift operation and any races during the capture operation.

All storage elements in PRPGs, 811 to 813, and MISRs, 820 to 822, can be connected into a scan chain from which predetermined patterns can be shifted in for reseeding and computed signatures can be shifted out for analysis. This configuration helps in increasing fault coverage and in facilitating fault diagnosis.

Figure 9:
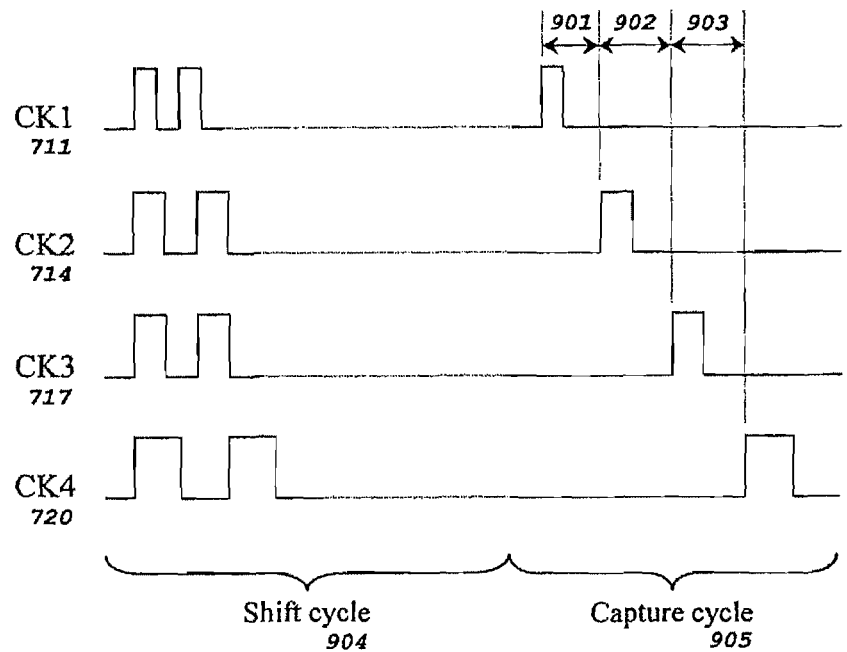
FIG. 9 shows a timing diagram of the full-scan design given in FIG. 7, in accordance with the present invention, where an ordered sequence of capture clocks is used to detect or locate stuck-at faults within each clock domain and stuck-at faults crossing clock domains in self-test mode.

FIG. 9 shows a timing diagram of a full-scan design given in FIG. 7, of one embodiment of the invention for detecting or locating stuck-at faults within each clock domain and stuck-at faults crossing clock domains with an ordered sequence of capture clocks in self-test mode. The timing diagram 900 shows the sequence of waveforms of the 4 capture clocks, CK1 711 to CK4 720, operating at different frequencies. This timing diagram is basically the same as the one given in FIG. 3 except the capture clocks, CK1 711 to CK4 720, run at 150 MHz, 100 MHz, 100 MHz, and 66 MHz, respectively, in both shift and capture cycles, instead of 10 MHz as in FIG. 3.

Figure 10:
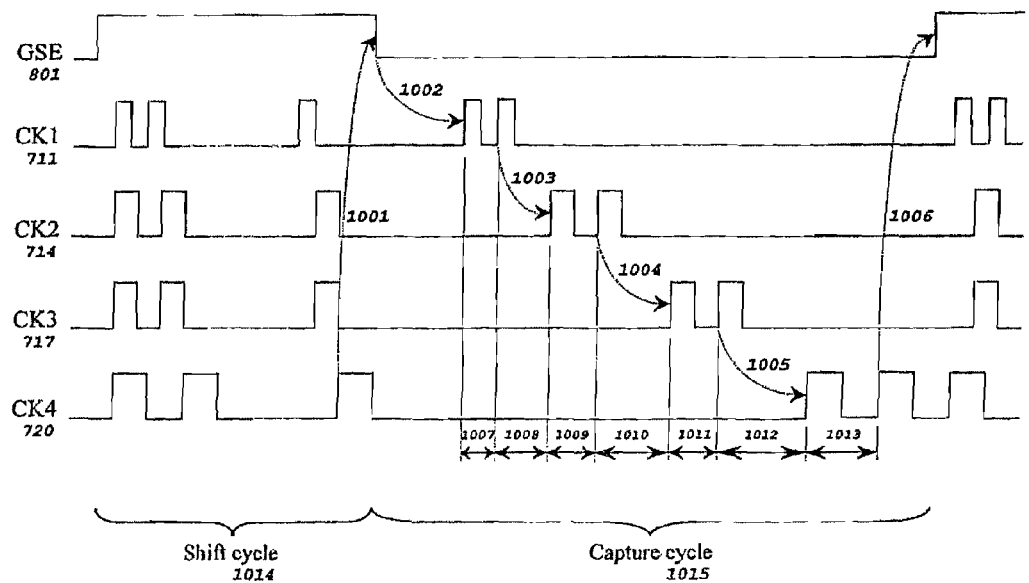
FIG. 10 shows a timing diagram of the full-scan design given in FIG. 7, in accordance with the present invention, where an ordered sequence of capture clocks is used to detect or locate delay faults within each clock domain and stuck-at faults crossing clock domains in self-test or scan-test mode. The chain of control events is also shown.

FIG. 10 shows a timing diagram of a full-scan design given in FIG. 7, of one embodiment of the invention for detecting or locating delay faults within each clock domain and stuck-at faults crossing clock domains with an ordered sequence of capture clocks in self-test or scan-test mode. The timing diagram 1000 shows the sequence of waveforms of the 4 capture clocks, CK1 711 to CK4 720, operating at different frequencies.

During each shift cycle 1014, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1015, 4 sets of capture clock pulses are applied in the following order: First, two capture pulses of 150 MHz are applied to CK1 711 to detect or locate delay faults within the clock domain CD1 702. Second, two capture pulses of 100 MHz are applied to CK2 714 to detect or locate delay faults within the clock domain CD2 703. Third, two capture pulses of 100 MHz are applied to CK3 717 to detect or locate delay faults within the clock domain CD3 704. Fourth, two capture pulses of 66 MHz are applied to CK4 720 to detect or locate delay faults within the clock domain CD4 705.

In addition, the stuck-at faults which can be reached from lines 721, 725, and 729 in the crossing clock-domain logic blocks CCD1 706 to CCD3 708, respectively, are also detected or located simultaneously if the following condition is satisfied: The relative clock delay 1008 between the rising edge of the second capture pulse of CK1 711 and the rising edge of the first capture pulse of CK2 714 must be adjusted so that no races or timing violations would occur while the output responses 723 are captured through the crossing clock-domain logic block CCD1 706.

The same principle applies to the relative clock delay 1010 between CK2 714 and CK3 717, and the relative clock delay 1012 between CK3 717 and CK4 720 for capturing the output responses, 727 and 731, through CCD2 707 and CCD3 708, respectively.

The daisy-chain clock-triggering technique is used to generate and order the sequence of capture clocks one after the other in the following way: The rising edge of the last pulse in the shift cycle triggers the event 1001 of applying 0 to the global scan enable GSE 801, switching the test operation from the shift cycle to the capture cycle. The falling edge of GSE 801 triggers the event 1002 of applying two capture pulses to CK1 711. Similarly, the rising edge of the second capture pulse of CK1 711 triggers the event 1003 of applying two capture pulses to CK2 714, the rising edge of the second capture pulse of CK2 714 triggers the event 1004 of applying two capture pulses to CK3 717, and the rising edge of the second capture pulse of CK3 717 triggers the event 1005 of applying two capture pulses to CK4 720. Finally, the rising edge of the second capture pulse of CK4 720 triggers the event 1006 of applying 1 to the global scan enable GSE 801, switching the test operation from the capture cycle to the shift cycle. This daisy-chain clock-triggering technique is also used to order the sequence of capture clocks in FIG. 9 and FIGS. 11 to 20.

Figure 11:
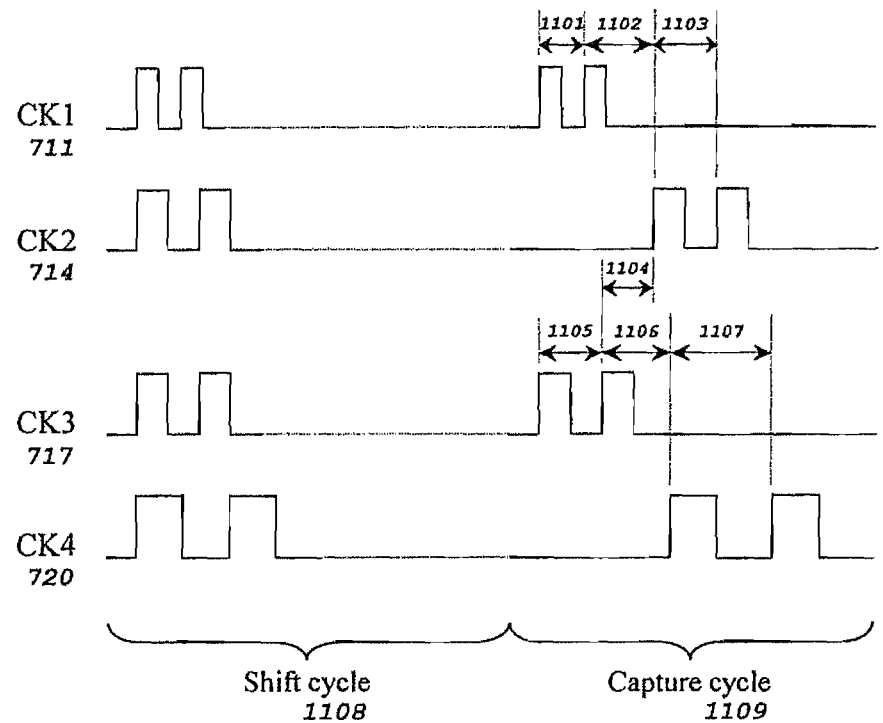
FIG. 11 shows a timing diagram of the full-scan design given in FIG. 7, in accordance with the present invention, where a shortened yet ordered sequence of capture clocks is used to detect or locate delay faults within each clock domain and stuck-at faults crossing clock domains in self-test or scan-test mode.

FIG. 11 shows a timing diagram of a full-scan design given in FIG. 7, of one embodiment of the invention for detecting or locating delay faults within each clock domain and stuck-at faults crossing clock domains with a shortened yet ordered sequence of capture clocks in self-test or scan-test mode. The timing diagram 1100 shows the sequence of waveforms of the 4 capture clocks, CK1 711 to CK4 720, operating at different frequencies.

During each shift cycle 1108, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1109, 4 sets of capture clock pulses are applied in the following order: First, two capture pulses of frequency 150 MHz are applied to CK1 711 and two clock pulses of frequency 100 MHz are applied to CK3 717, simultaneously, to detect or locate delay faults within the clock domain CD1 702 and CD3 704, respectively. Second, two capture pulses of frequency 100 MHz are applied to CK2 714 and two capture pulses of frequency 66 MHz are applied to CK4 720, simultaneously, to detect or locate delay faults within the clock domain CD2 703 and CD4 705, respectively.

In addition, the stuck-at faults which can be reached from lines 721, 728, and 729 in the crossing clock-domain logic blocks CCD1 706 to CCD3 708, respectively, are also detected or located simultaneously if the following condition is satisfied: The relative clock delay 1102 between the rising edge of the second capture pulse of CK1 711 and the rising edge of the first capture pulse of CK2 714 must be adjusted so that no races or timing violations would occur while the output responses 723 are captured through the crossing clock-domain logic block CCD1 706.

The same principle applies to the relative clock delay 1104 between CK3 717 and CK2 714, and the relative clock delay 1106 between CK3 717 and CK4 720 for capturing the output responses, 726 and 731, through CCD2 707 and CCD3 708, respectively.

Figure 12:
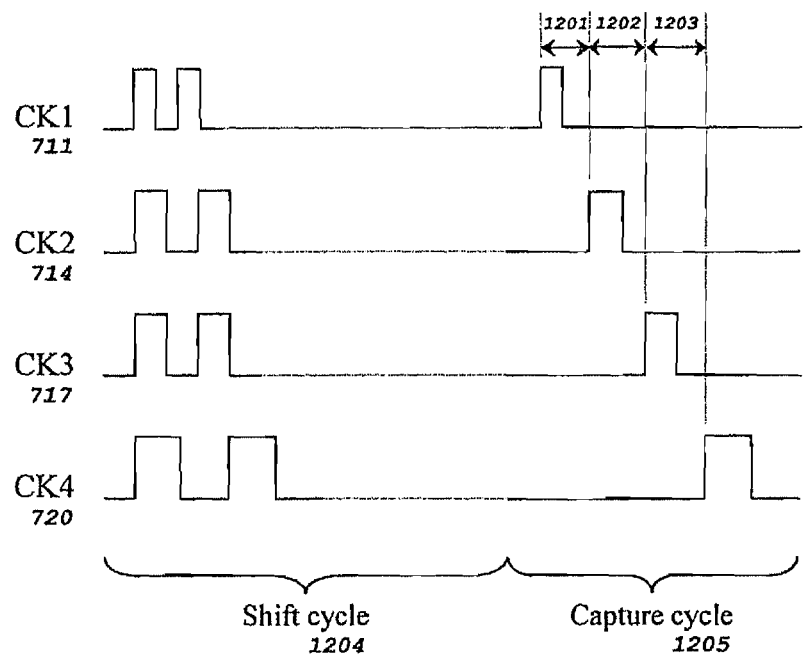
FIG. 12 shows a timing diagram of the full-scan design given in FIG. 7, in accordance with the present invention, where an ordered sequence of capture clocks is used to detect or locate stuck-at faults within each clock domain and delay faults crossing clock domains in self-test or scan-test mode.

FIG. 12 shows a timing diagram of a full-scan design given in FIG. 7, of one embodiment of the invention for detecting or locating stuck-at faults within each clock domain and delay faults crossing clock domains with an ordered sequence of capture clocks in self-test or scan-test mode. The timing diagram 1200 shows the sequence of waveforms of the 4 capture clocks, CK1 711 to CK4 720, operating at different frequencies.

During each shift cycle 1204, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1205, 4 sets of capture clock pulses are applied in the following order: First, one capture pulse of 150 MHz is applied to CK1 711 to detect or locate stuck-at faults within the clock domain CD1 702. Second, one capture pulse of 100 MHz is applied to CK2 714 to detect or locate stuck-at faults within the clock domain CD2 703. Third, one capture pulse of 100 MHz is applied to CK3 717 to detect or locate stuck-at faults within the clock domain CD3 704. Fourth, one capture pulse of 66 MHz is applied to CK4 720 to detect or locate stuck-at faults within the clock domain CD4 705.

In addition, the delay faults which can be reached from lines 721, 725, and 729 in the crossing clock-domain logic blocks CCD1 706 to CCD3 708, respectively, are also detected or located simultaneously if the following condition is satisfied: The relative clock delays 1201 between the rising edge of the capture pulse of CK1 711 and the rising edge of the capture pulse of CK2 714 must be adjusted to meet the at-speed timing requirements for paths from 721 to 723. Similarly, the relative clock delay 1202 between CK2 714 and CK3 717, and the relative clock delay 1203 between CK3 717 and CK4 720, must be adjusted to meet the at-speed timing requirements for paths from 725 to 727, and paths from 729 to 731, respectively.

Figure 13:
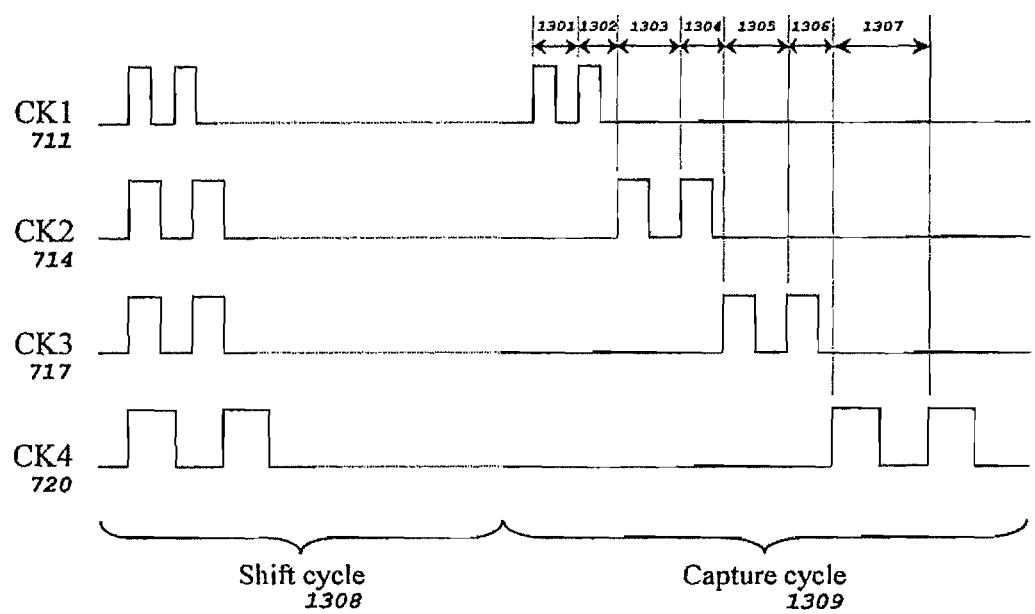
FIG. 13 shows a timing diagram of the full-scan design given in FIG. 7, in accordance with the present invention, where an ordered sequence of capture clocks is used to detect or locate delay faults within each clock domain and delay faults crossing clock domains in self-test or scan-test mode.

FIG. 13 shows a timing diagram of a full-scan design given in FIG. 7, of one embodiment of the invention for detecting or locating delay faults within each clock domain and delay faults crossing clock domains with an ordered sequence of capture clocks in self-test or scan-test mode. The timing diagram 1300 shows the sequence of waveforms of the 4 capture clocks, CK1 711 to CK4 720, operating at different frequencies.

During each shift cycle 1308, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1309, 4 sets of capture clock pulses are applied in the following order: First, two capture pulses of 150 MHz are applied to CK1 711 to detect or locate delay faults within the clock domain CD1 702. Second, two capture pulses of 100 MHz are applied to CK2 714 to detect or locate delay faults within the clock domain CD2 703. Third, two capture pulses of 100 MHz are applied to CK3 717 to detect or locate delay faults within the clock domain CD3 704. Fourth, two capture pulses of 66 MHz are applied to CK4 720 to detect or locate delay faults within the clock domain CD4 705.

In addition, the delay faults which can be reached from lines 721, 725, and 729 in the crossing clock-domain logic blocks CCD1 706 to CCD3 708, respectively, are also detected or located simultaneously if the following condition is satisfied: The relative clock delay 1302 between the rising edge of the second capture pulse of CK1 711 and the rising edge of the first capture pulse of CK2 714 must be adjusted to meet the at-speed timing requirements for paths from 721 to 723. Similarly, the relative clock delay 1304 between CK2 714 and CK3 717, and the relative clock delay 1306 between CK3 717 and CK4 720, must be adjusted to meet the at-speed timing requirements for paths from 725 to 727, and paths from 729 and 731, respectively.

Figure 14:
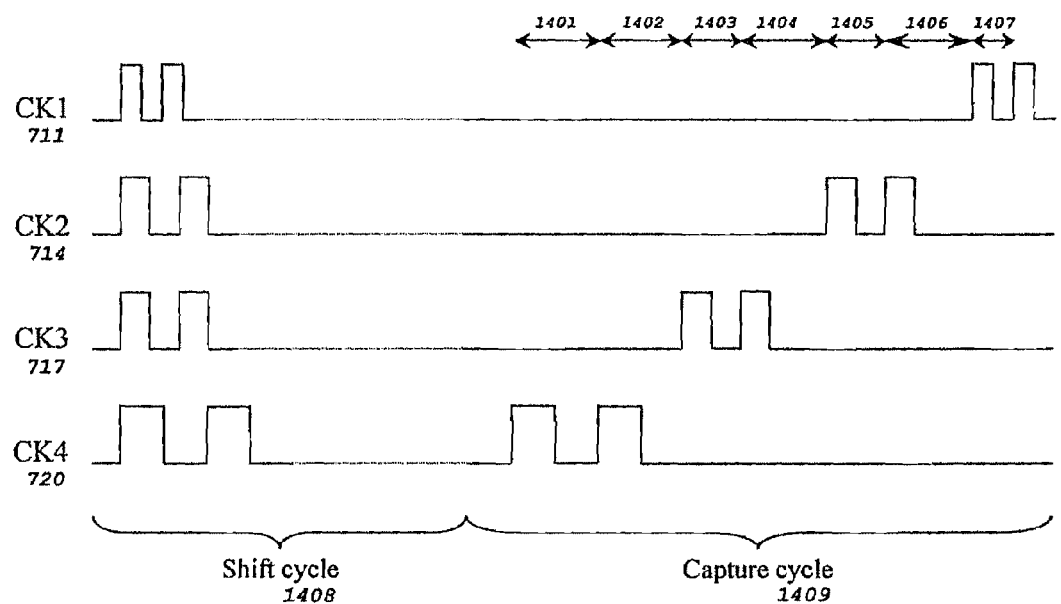
FIG. 14 shows a timing diagram of the full-scan design given in FIG. 7, in accordance with the present invention, where a reordered sequence of capture clocks is used to detect or locate delay faults within each clock domain and stuck-at faults crossing clock domains in self-test or scan-test mode.

FIG. 14 shows a timing diagram of a full-scan design given in FIG. 7, of one embodiment of the invention for detecting or locating delay faults within each clock domain and stuck-at faults crossing clock domains with a reordered sequence of capture clocks in self-test or scan-test mode. The timing diagram 1400 shows the sequence of waveforms of the 4 capture clocks, CK1 711 to CK4 720, operating at different frequencies.

During each shift cycle 1408, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1409, 4 sets of capture clock pulses are applied in the following order: First, two capture pulses of 66 MHz are applied to CK4 720 to detect or locate delay faults within the clock domain CD4 705. Second, two capture pulses of 100 MHz are applied to CK3 717 to detect or locate delay faults within the clock domain CD3 704. Third, two capture pulses of 100 MHz are applied to CK2 714 to detect or locate delay faults within the clock domain CD2

703. Fourth, two capture pulses of 150 MHz are applied to CK1 711 to detect or locate delay faults within the clock domain CD1 702.

In addition, the stuck-at faults which can be reached from lines 724, 728, and 732 in the crossing clock-domain logic blocks CCD1 706 to CCD3 708, respectively, are also detected or located simultaneously if the following condition is satisfied: The relative clock delay 1402 between the rising edge of the second capture pulse of CK4 720 and the rising edge of the first capture pulse of CK3 717 must be adjusted so that no races or timing violations would occur while the output responses 730 are captured through the crossing clock-domain logic block CCD3 708.

The same principle applies to the relative clock delay 1404 between CK3 717 and CK2 714, and the relative clock delay 1406 between CK2 714 and CK1 711 for capturing output responses, 726 and 722, through CCD2 707 and CCD1 706, respectively.

Figure 15:
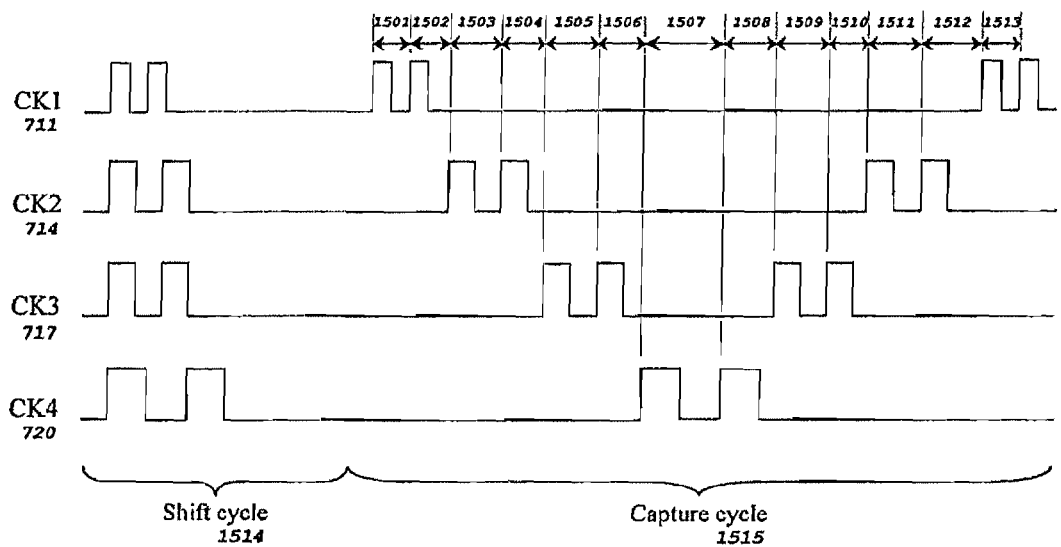
FIG. 15 shows a timing diagram of the full-scan design given in FIG. 7, in accordance with the present invention, where an expanded yet ordered sequence of capture clocks is used to detect or locate additional delay faults within each clock domain and additional stuck-at faults crossing clock domains in self-test or scan-test mode.

FIG. 15 shows a timing diagram of a full-scan design given in FIG. 7, of one embodiment of the invention for detecting or locating additional delay faults within each clock domain and additional stuck-at faults crossing clock domains with an expanded yet ordered sequence of capture clocks in self-test or scan-test mode. The timing diagram 1500 shows the sequence of waveforms of the 4 capture clocks, CK1 711 to CK4 720, operating at different frequencies.

During each shift cycle 1514, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1515, seven sets of double-capture pulses are applied in the following order: First, two capture pulses of 150 MHz are applied to CK1 711. Second, two capture pulses of 100 MHz are applied to CK2 714. Third, two capture pulses of 100 MHz are applied to CK3 717. Fourth, two capture pulses of 66 MHz are applied to CK4 720. Fifth, two capture pulses of 100 MHz are applied to CK3 717. Sixth, two capture pulses of 100 MHz are applied to CK2 714. Seventh, two capture pulses of 150 MHz are applied to CK1 711.

For the capture clock CK1 711, the second pulse and the third pulse are used to launch the transition needed for detecting or locating delay faults within the clock domain CD1 702. Since the transition is generated by two close-to-functional patterns, the risk of activating a false path is lower. In addition, additional delay faults within the clock domain CD1 702 can be detected or located by the transition. The same results also apply to the clock domains CD2 703 and CD3 704.

In addition, the stuck-at faults which can be reached from lines 724, 728, and 732 in the crossing clock-domain logic blocks CCD1 706 to CCD3 708, respectively, are also detected or located simultaneously if the following condition is satisfied: The relative clock delay 1508 between the rising edge of the second capture pulse of CK4 720 and the rising edge of the first capture pulse of CK3 717 must be adjusted so that no races or timing violations would occur while the output responses 730 are captured through the crossing clock-domain logic block CCD3 708.

The same principle applies to the relative clock delay 1510 between CK3 717 and CK2 714, and the relative clock delay 1512 between CK2 714 and CK1 711 for capturing output responses, 726 and 722, through CCD2 707 and CCD1 706, respectively.

Figure 16:
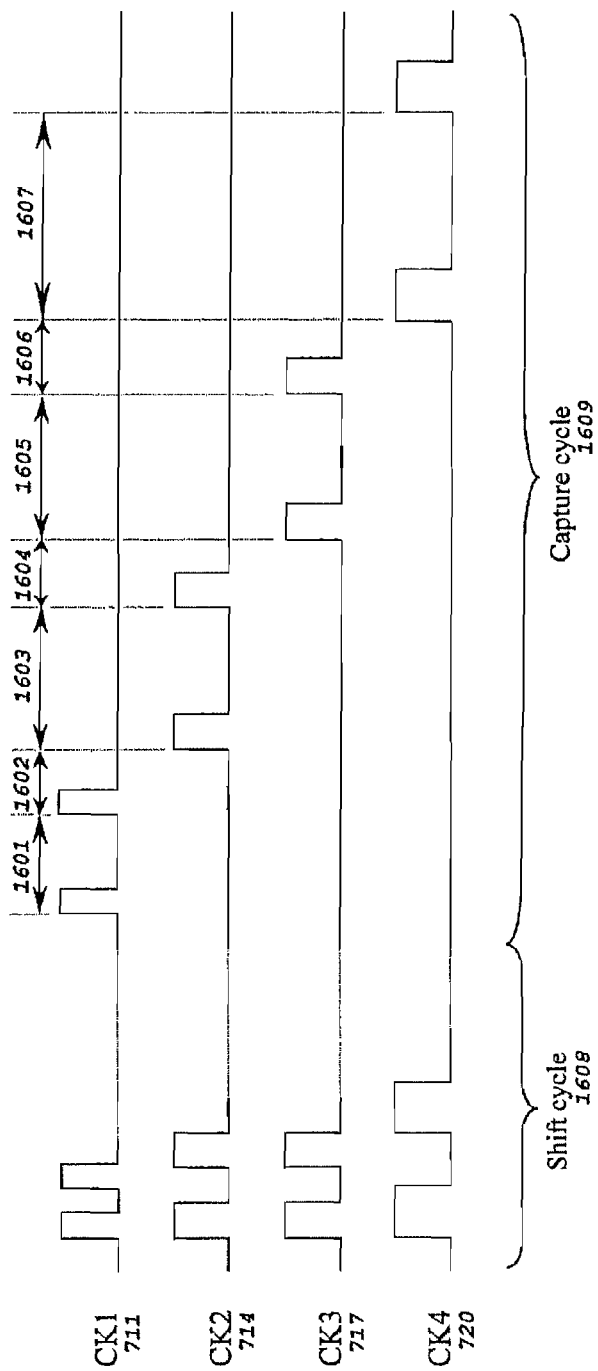
FIG. 16 shows a timing diagram of the full-scan design given in FIG. 7, in accordance with the present invention, where an ordered sequence of capture clocks is used to detect or locate 2-cycle delay faults within each clock domain and stuck-at faults crossing clock domains in self-test or scan-test mode.

FIG. 16 shows a timing diagram of a full-scan design given in FIG. 7, of one embodiment of the invention for detecting or locating 2-cycle delay faults within each clock domain and stuck-at faults crossing clock domains with an ordered sequence of capture clocks in self-test or scan-test mode. It is assumed that some paths in the clock domains, CD1 702 to CD4 705, need two cycles for signals to pass through. The timing diagram 1600 shows the sequence of waveforms of the 4 capture clocks, CK1 711 to CK4 720, operating at different frequencies.

During each shift cycle 1608, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1609, 4 sets of capture clock pulses are applied in the following order: First, two capture pulses of 75 MHz (half of 150 MHz) are applied to CK1 711 to detect or locate 2-cycle delay faults within the clock domain CD1 702. Second, two capture pulses of 50 MHz (half of 100 MHz) are applied to CK2 714 to detect or locate 2-cycle delay faults within the clock domain CD2 703. Third, two capture pulses of 50 MHz (half of 100 MHz) are applied to CK3 717 to detect or locate 2-cycle delay faults within the clock domain CD3 704. Fourth, two capture pulses of 33 MHz (half of 66 MHz) are applied to CK4 720 to detect or locate 2-cycle delay faults within the clock domain CD4 705.

In addition, the stuck-at faults which can be reached from lines 721, 725, and 729 in the crossing clock-domain logic blocks CCD1 706 to CCD3 708, respectively, are also detected or located simultaneously if the following condition is satisfied: The relative clock delay 1602 between the rising edge of the second capture pulse of CK1 711 and the rising edge of the first capture pulse of CK2 714 must be adjusted so that no races or timing violations would occur while the output responses 723 are captured through the crossing clock-domain logic block CCD1 706.

The same principle applies to the relative clock delay 1604 between CK2 714 and CK3 717, and the relative clock delay 1606 between CK3 717 and CK4 720 for capturing output responses, 727 and 731, through CCD2 707 and CCD3 708, respectively.

Figure 17:
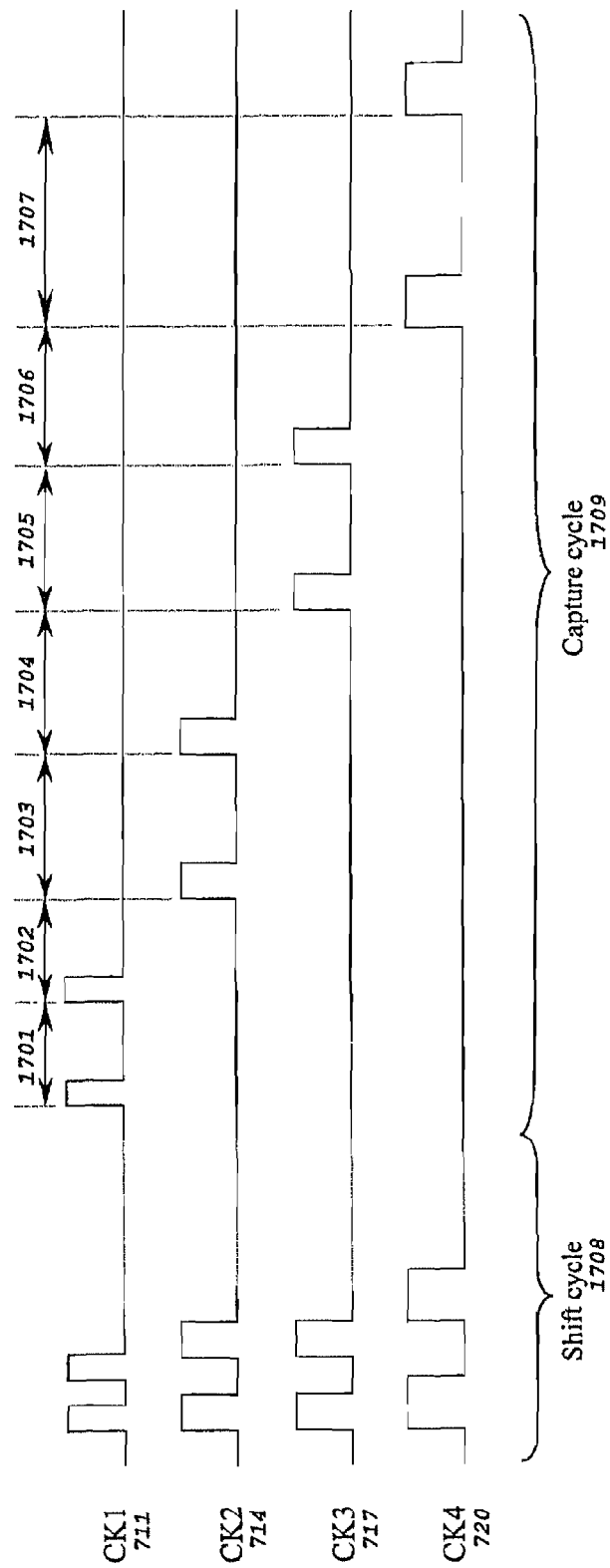
FIG. 17 shows a timing diagram of the full-scan design given in FIG. 7, in accordance with the present invention, where an ordered sequence of capture clocks is used to detect or locate 2-cycle delay faults within each clock domain and 2-cycle delay faults crossing clock domains in self-test or scan-test mod.

FIG. 17 shows a timing diagram of a full-scan design given in FIG. 7, of one embodiment of the invention for detecting or locating 2-cycle delay faults within each clock domain and 2-cycle delay faults crossing clock domains with an ordered sequence of capture clocks in self-test or scan-test mode. It is assumed that some paths in the clock domains, CD1 702 to CD4 705, and the crossing clock-domain logic blocks, CCD1 706 to CCD3 708, need two cycles for signals to pass through. The timing diagram 1700 shows the sequence of waveforms of the 4 capture clocks, CK1 711 to CK4 720, operating at different frequencies.

During each shift cycle 1708, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1709, 4 sets of capture clock pulses are applied in the following order: First, two capture pulses of 75 MHz (half of 150 MHz) are applied to CK1 711 to detect or locate 2-cycle delay faults within the clock domain CD1 702. Second, two capture pulses of 50 MHz (half of 100 MHz) are applied to CK2 714 to detect or locate 2-cycle delay faults within the clock domain CD2 703. Third, two capture pulses of 50 MHz (half of 100 MHz) are applied to CK3 717 to detect or locate 2-cycle delay faults within the clock domain CD3 704. Fourth, two capture pulses of 33 MHz (half of 66 MHz) are applied to CK4 720 to detect or locate 2-cycle delay faults within the clock domain CD4 705.

In addition, the 2-cycle delay faults which can be reached from lines 721, 725, and 729 in the crossing clock-domain logic blocks CCD1 706 to CCD3 708, respectively, are also detected or located simultaneously if the following condition is satisfied: The relative clock delay 1702 between the rising edge of the second capture pulse of CK1 711 and the rising edge of the first capture pulse of CK2 714 must be adjusted to meet the 2-cycle timing requirements for paths from 721 to 723. Similarly, the relative clock delay 1704 between CK2 714 and CK3 717, and the relative clock delay 1706 between CK3 717 and CK4 720, must be adjusted to meet the 2-cycle timing requirements for paths from 725 to 727, and paths from 729 and 731, respectively.

Figure 18:
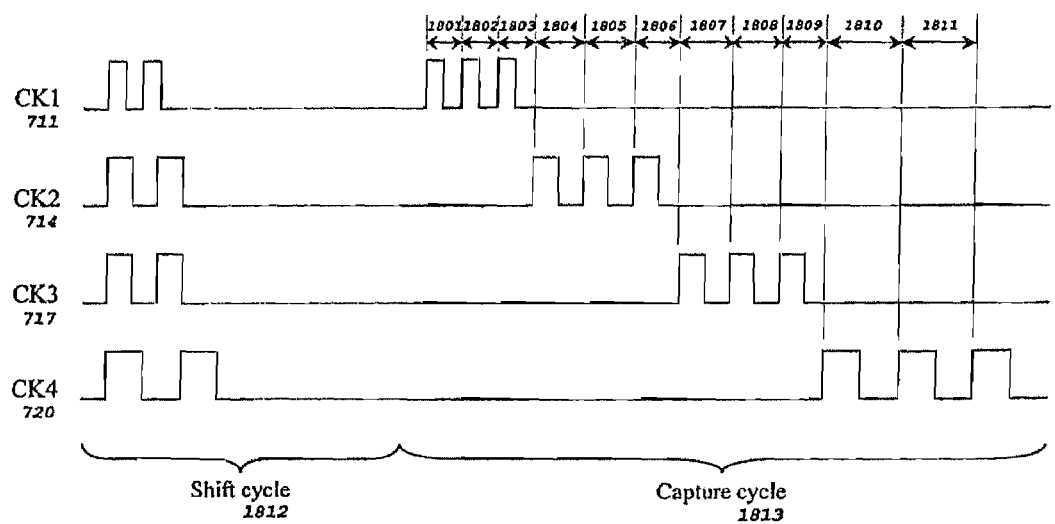
FIG. 18 shows a timing diagram of the partial-scan design given in FIG. 7, in accordance with the present invention, where an ordered sequence of capture clocks is used to detect or locate stuck-at faults within each clock domain and stuck-at faults crossing clock domains in self-test or scan-test mode.

FIG. 18 shows a timing diagram of a feed-forward partial-scan design given in FIG. 7, of one embodiment of the invention for detecting or locating stuck-at faults within each clock domain and stuck-at faults crossing clock domains with an ordered sequence of capture clocks in self-test or scan-test mode. It is assumed that the clock domains CD1 702 to CD4 705 contain a number of un-scanned storage cells that form a sequential depth of no more than 2. The timing diagram 1800 shows the sequence of waveforms of the 4 capture clocks, CK1 711 to CK4 720, operating at different frequencies.

During each shift cycle 1812, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1813, 4 sets of capture clock pulses are applied in the following order: First, three pulses of 150 MHz, two being functional pulses and one being a capture pulse, are applied to CK1 711 to detect or locate stuck-at faults within the clock domain CD1 702. Second, three pulses of 100 MHz, two being functional pulses and one being a capture pulse, are applied to CK2 714 to detect or locate stuck-at faults within the clock domain CD2 703. Third, three pulses of 100 MHz, two being functional pulses and one being a capture pulse, are applied to CK3 717 to detect or locate stuck-at faults within the clock domain CD3 704. Fourth, three pulses of frequency 66 MHz, two being functional pulses and one being a capture pulse, are applied to CK4 717 to detect or locate stuck-at faults within the clock domain CD4 705.

In addition, the stuck-at faults which can be reached from lines 721, 725, and 729 in the crossing clock-domain logic blocks CCD1 706 to CCD3 708, respectively, are also detected or located simultaneously if the following condition is satisfied: The relative clock delay 1803 between the rising edge of the second capture pulse of CK1 711 and the rising edge of the first capture pulse of CK2 714 must be adjusted so that no races or timing violations would occur while the output responses 723 are captured through the crossing clock-domain logic block CCD1 706.

The same principle applies to the relative clock delay 1806 between CK2 714 and CK3 717, and the relative clock delay 1809 between CK3 717 and CK4 720 for capturing output responses, 727 and 731, through CCD2 707 and CCD3 708, respectively.

Figure 19:
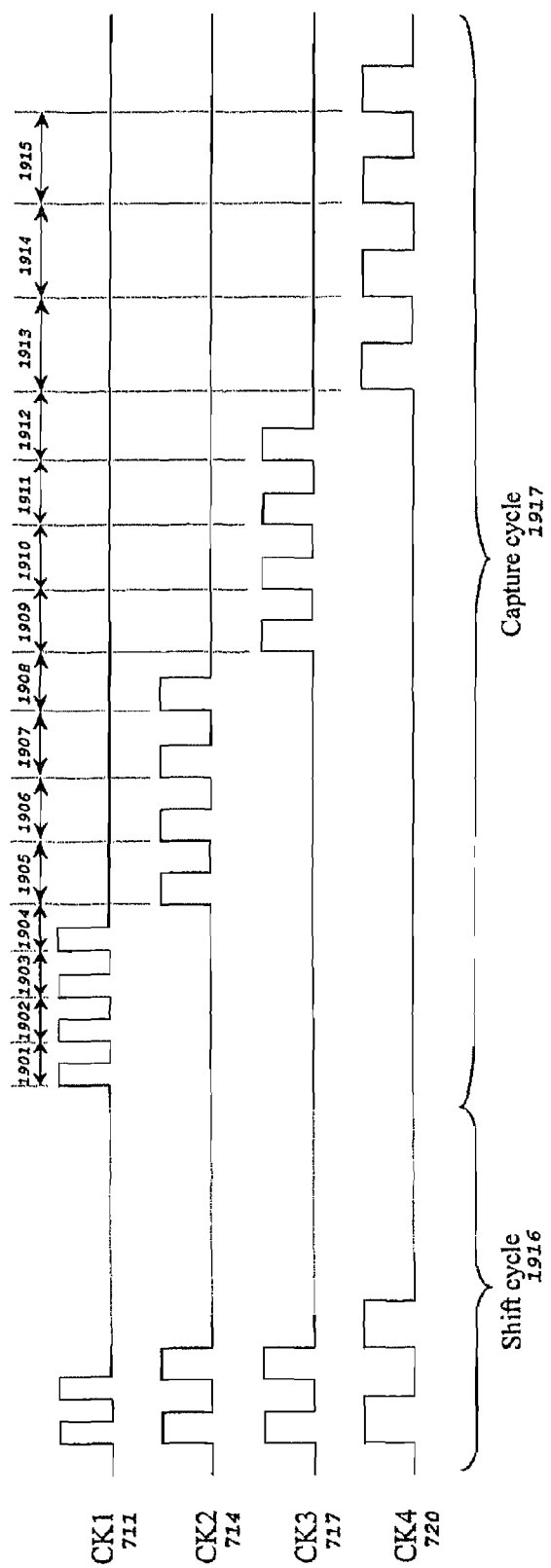
FIG. 19 shows a timing diagram of the partial-scan design given in FIG. 7, in accordance with the present invention, where an ordered sequence of capture clocks is used to detect or locate delay faults within each clock domain and stuck-at faults crossing clock domains in self-test or scan-test mode.

FIG. 19 shows a timing diagram of a feed-forward partial-scan design given in FIG. 7, of one embodiment of the invention for detecting or locating delay faults within each clock domain and stuck-at faults crossing clock domains with an ordered sequence of capture clocks in self-test or scan-test mode. It is assumed that the clock domains CD1 702 to CD4 705 contain a number of un-scanned storage cells that form a sequential depth of no more than 2. The timing diagram 1900 shows the sequence of waveforms of the 4 capture clocks, CK1 711 to CK4 720, operating at different frequencies.

During each shift cycle 1916, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 1917, 4 sets of capture clock pulses are applied in the following order: First, 4 pulses of 150 MHz, two being functional pulses and two being capture pulses, are applied to CK1 711 to detect or locate delay faults within the clock domain CD1 702. Second, 4 pulses of 100 MHz, two being functional pulses and two being capture pulses, are applied to CK2 714 to detect or locate delay faults within the clock domain CD2 703. Third, 4 pulses of 100 MHz, two being functional pulses and two being capture pulses, are applied to CK3 717 to detect or locate delay faults within the clock domain CD3 704. Fourth, 4 pulses of 66 MHz, two being functional pulses and two being capture pulses, are applied to CK4 720 to detect or locate delay faults within the clock domain CD4 705.

In addition, the stuck-at faults which can be reached from lines 721, 725, and 729 in the crossing clock-domain logic blocks CCD1 706 to CCD3 708, respectively, are also detected or located simultaneously if the following condition is satisfied: The relative clock delay 1904 between the rising edge of the second capture pulse of CK1 711 and the rising edge of the first capture pulse of CK2 714 must be adjusted so that no races or timing violations would occur while the output responses 723 are captured through the crossing clock-domain logic block CCD1 706.

The same principle applies to the relative clock delay 1908 between CK2 714 and CK3 717, and the relative clock delay 1912 between CK3 717 and CK4 720 for capturing output responses, 727 and 731, through CCD2 707 and CCD3 708, respectively.

Figure 20:
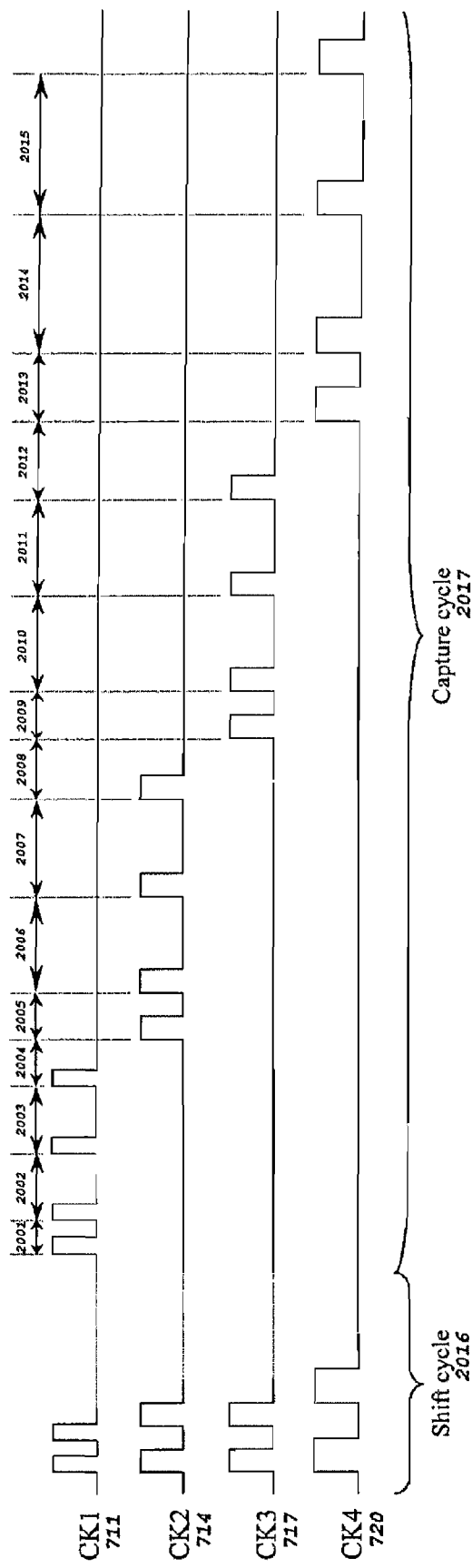
FIG. 20 shows a timing diagram of the partial-scan design given in FIG. 7, in accordance with the present invention, where an ordered sequence of capture clocks is used to detect or locate 2-cycle delay faults within each clock domain and stuck-at faults crossing clock domains in self-test or scan-test mode.

FIG. 20 shows a timing diagram of a feed-forward partial-scan design given in FIG. 7, of one embodiment of the invention for detecting or locating 2-cycle delay faults within each clock domain and stuck-at faults crossing clock domains with an ordered sequence of capture clocks in self-test or scan-test mode. It is assumed that the clock domains CD1 702 to CD4 705 contain a number of un-scanned storage cells that form a sequential depth of no more than 2. Also, it is assumed that some paths in the clock domains, CD1 702 to CD4 705, need two cycles for signals to pass through. The timing diagram 2000 shows the sequence of waveforms of the 4 capture clocks, CK1 711 to CK4 720, operating at different frequencies.

During each shift cycle 2016, a series of clock pulses of different frequencies, 150 MHz, 100 MHz, 100 MHz, and 66 MHz, are applied through capture clocks, CK1 711 to CK4 720, to shift stimuli to all scan cells within all clock domains, CD1 702 to CD4 705.

During each capture cycle 2017, 4 sets of capture clock pulses are applied in the following order: First, 4 pulses, two being functional pulses of 150 MHz and two being capture pulses of 75 MHz (half of 150 MHz), are applied to CK1 711 to detect or locate 2-cycle delay faults within the clock domain CD1 702. Second, 4 pulses, two being functional pulses of 100 MHz and two being capture pulses of 50 MHz (half of 100 MHz), are applied to CK2 714 to detect or locate 2-cycle delay faults within the clock domain CD2 703. Third, 4 pulses, two being functional pulses of 100 MHz and two being capture pulses of 50 MHz (half of 100 MHz), are applied to CK3 717 to detect or locate 2-cycle delay faults within the clock domain CD3 704. Fourth, 4 pulses, 2 being functional pulses of 66 MHz and 2 being capture pulses of 33 MHz (half of 66 MHz), are applied to CK4 720 to detect or locate 2-cycle delay faults within the clock domain CD4 705.

In addition, the stuck-at faults which can be reached from lines 721, 725, and 729 in the crossing clock-domain logic blocks CCD1 706 to CCD3 708, respectively, are also detected or located simultaneously if the following condition is satisfied: The relative clock delay 2004 between the rising edge of the second capture pulse of CK1 711 and the rising edge of the first capture pulse of CK2 714 must be adjusted so that no races or timing violations would occur while the output responses 723 are captured through the crossing clock-domain logic block CCD1 706.

The same principle applies to the relative clock delay 2008 between CK2 714 and CK3 717, and the relative clock delay 2012 between CK3 717 and CK4 720 for capturing output responses, 727 and 731, through CCD2 707 and CCD3 708, respectively.

Figure 21:
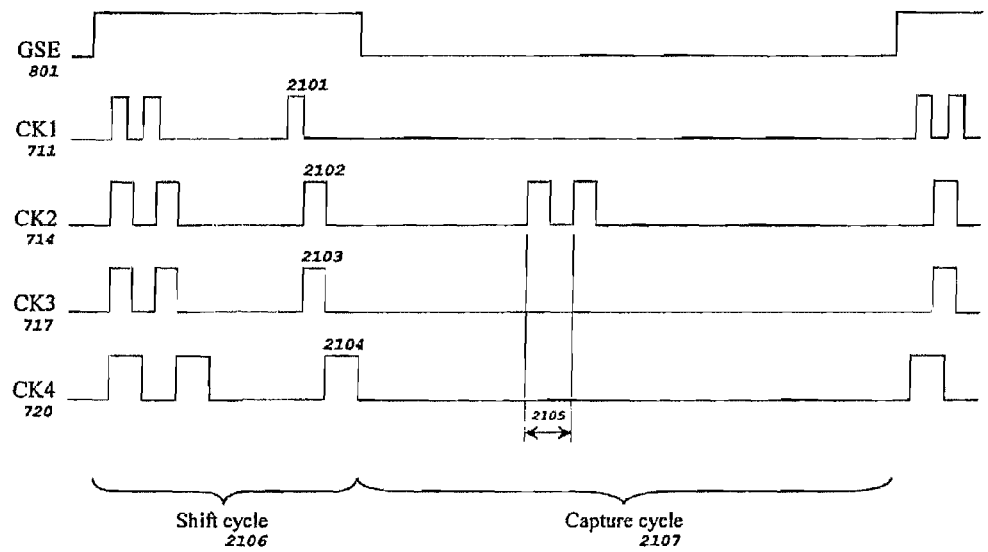
FIG. 21 shows a timing diagram of the full-scan design given in FIG. 7, in accordance with the present invention, where the capture clock CK2 during the capture cycle is chosen to diagnose faults captured by CK2 in self-test or scan-test mode.

FIG. 21 shows a timing diagram of the full-scan design given in FIG. 7, in accordance with the present invention, where the capture clock CK2 during the capture cycle is chosen to diagnose faults captured by CK2 in self-test or scan-test mode.

Fault diagnosis is the procedure by which a fault is located. In order to achieve this goal, it is often necessary to use an approach where a test pattern detects only portion of faults while guaranteeing no other faults are detected. If the test pattern does produce a response that matches the observed response, it can then be declared that the portion must contain at least one actual fault. Then the same approach to the portion of the faults to further localize the actual faults.

The timing diagram 2100 shows a way to facilitate this approach. In the capture cycle 2107, two capture pulses of 100 MHz are only applied to the capture clock CK2 714 while the other three capture clocks are held inactive. As a result, for delay faults, only those in the clock domain CD2 703 are detected. In addition, for stuck-at faults, only those in the crossing clock-domain logic blocks CCD1 706 and CCD2 707 and the clock domain CD2 703 are detected. Obviously, this clock timing helps in fault diagnosis.

Figure 22:
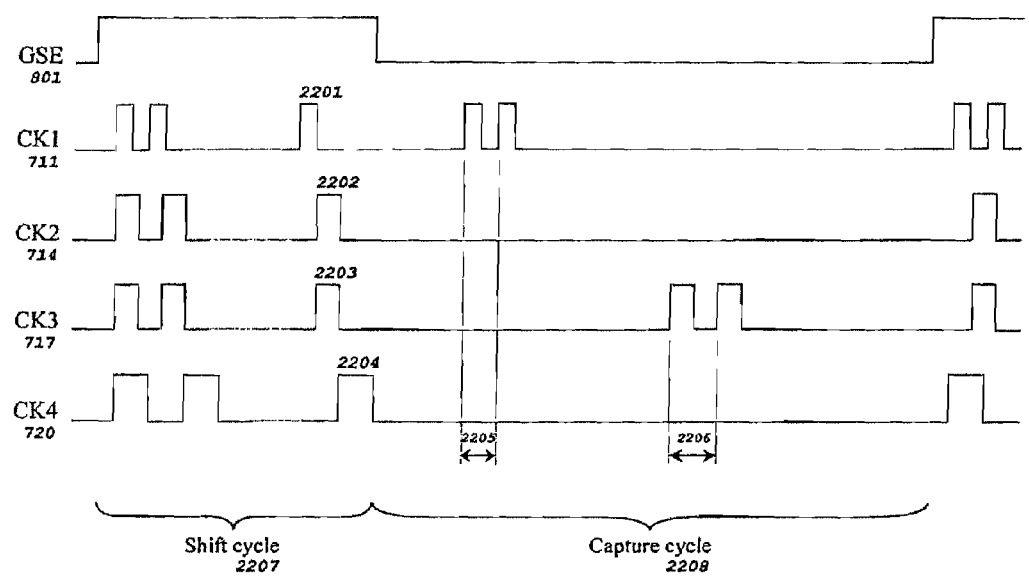
FIG. 22 shows a timing diagram of the full-scan design given in FIG. 7, in accordance with the present invention, where the capture clocks CK1 and CK3 during the capture cycle are chosen to diagnose faults captured by CK1 and CK3 in self-test or scan-test mode.

FIG. 22 shows a timing diagram of the full-scan design given in FIG. 7, in accordance with the present invention, where the capture clocks CK1 and CK3 during the capture cycle are chosen to diagnose faults captured by CK1 and CK3 in self-test or scan-test mode.

The diagram 2200 shows one more timing scheme that can help fault diagnosis as described in the description of FIG. 21. In the capture cycle 2208, two capture pulses of 150 MHz are applied to the capture clock CK1 711 and two capture pulses of 100 MHz are applied to the capture clock CK3 717 while the other two capture clocks are held inactive. As a result, for delay faults, only those in the clock domain CD1 702 and CD3 704 are detected. In addition, for stuck-at faults, only those in the crossing clock-domain logic blocks CCD1 706 to CCD3 708 and the clock domains CD1 702 and CD3 703 are detected. Obviously, this clock timing helps in fault diagnosis.

Figure 23:
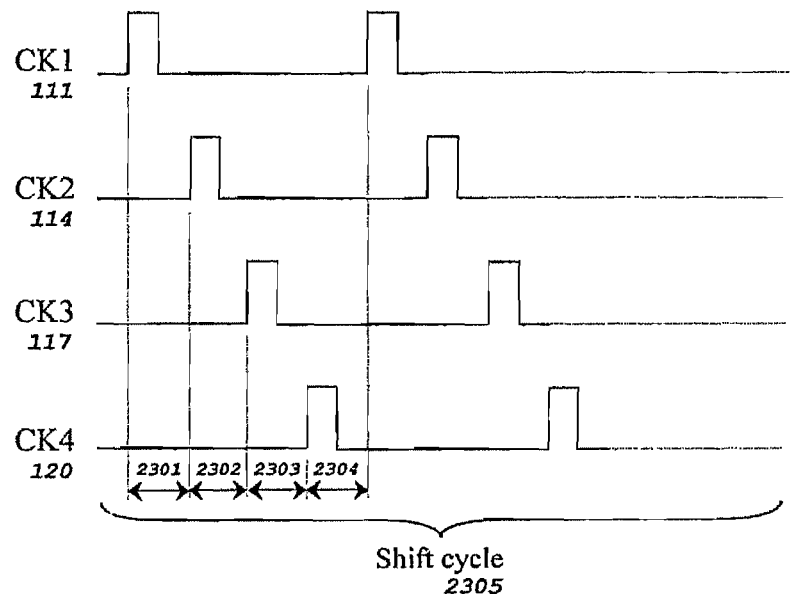
FIG. 23 shows a timing diagram of the full-scan design given in FIG. 1, in accordance with the present invention, where all capture clocks during the shift cycle are skewed to reduce power consumption.

FIG. 23 shows a timing diagram of the full-scan design given in FIG. 1, in accordance with the present invention, where all capture clocks during the shift cycle are skewed to reduce power consumption. The timing diagram 2300 only shows the waveforms for the capture clocks CK1 111 to CK4 120 during the shift cycle. For the capture cycle, any capture timing control methods claimed in this patent can be applied.

During the shift cycle 2305, clock pulses for the clocks CK1 111 to CK4 120 are skewed by properly setting the delay 2301 between the shift pulses for the clocks CK1 111 and CK2 114, the delay 2302 between the shift pulses for the clocks CK2 114 and CK3 117, the delay 2303 between the shift pulses for the clocks CK3 117 and CK4 120, the delay 2304 between the shift pulses for the clocks CK4 120 and CK1 111. As a result, both peak power consumption and average power consumption are reduced. In addition, during the capture cycle, the PRPG 212 is driven by clock CK2 114, the first-arrived capture clock, and the MISR 221 is driven by clock CK3 117, the last-arrived capture clock, in the shared PRPG-MISR pair 228 in FIG. 2. Thus, the ordered capture sequence guarantees the correct capture operation when a shared PRPG-MISR pair is used for a plurality of clock domains in self-test mode.

Figure 24:
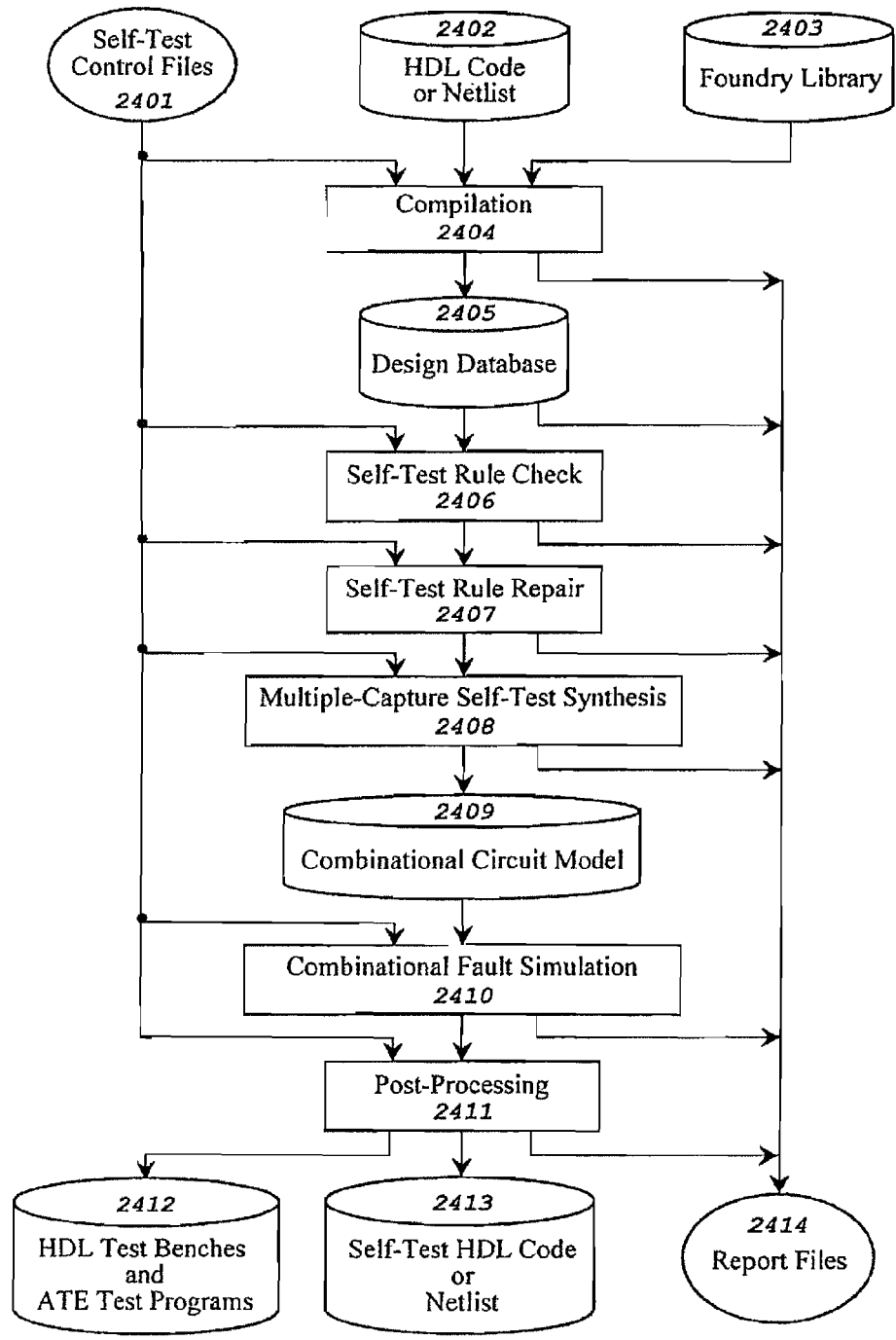
FIG. 24 shows a multiple-capture CAD system in accordance with the present invention, where a CAD system is used to implement the multiple-capture DFT technique on a full-scan or partial-scan design in self-test mode.

FIG. 24 shows a flow chart of one embodiment of the invention. The multiple-capture self-test computer-aided design (CAD) system 2400 accepts the user-supplied HDL code or netlist 2402 together with the self-test control files 2401 and the chosen foundry library 2403. The self-test control files 2401 contain all set-up information and scripts required for compilation 2404, self-test rule check 2406, self-test rule repair 2507, and multiple-capture self-test synthesis 2408. As a result, an equivalent combinational circuit model 2409 is generated. Then, combinational fault simulation 2410 can be performed. Finally, post-processing 2411 is used to produce the final self-test HDL code or netlist 2412 as well as the HDL test benches and ATE test programs 2413. All reports and errors are saved in the report files 2414.

The multiple-capture self-test synthesis 2408 uses a hierarchical approach in which it synthesizes a plurality of PRPG-MISR pairs one at a time for each individual clock domain or combined clock domains, then synthesizes a central self-test controller which includes an error indicator, and finally stitches the central self-test controller together with synthesized PRPG-MISR pairs. Each PRPG-MISR pair is composed of a PRPG, an optional phase shifter, an optional space compactor, a MISR, and a comparator. In addition, during PRPG-MISR synthesis, a number of spare scan cells can be inserted into selected clock domains. As a result, the central self-test controller can remain intact even when the need for circuit modification rises at a later stage.

Figure 25:
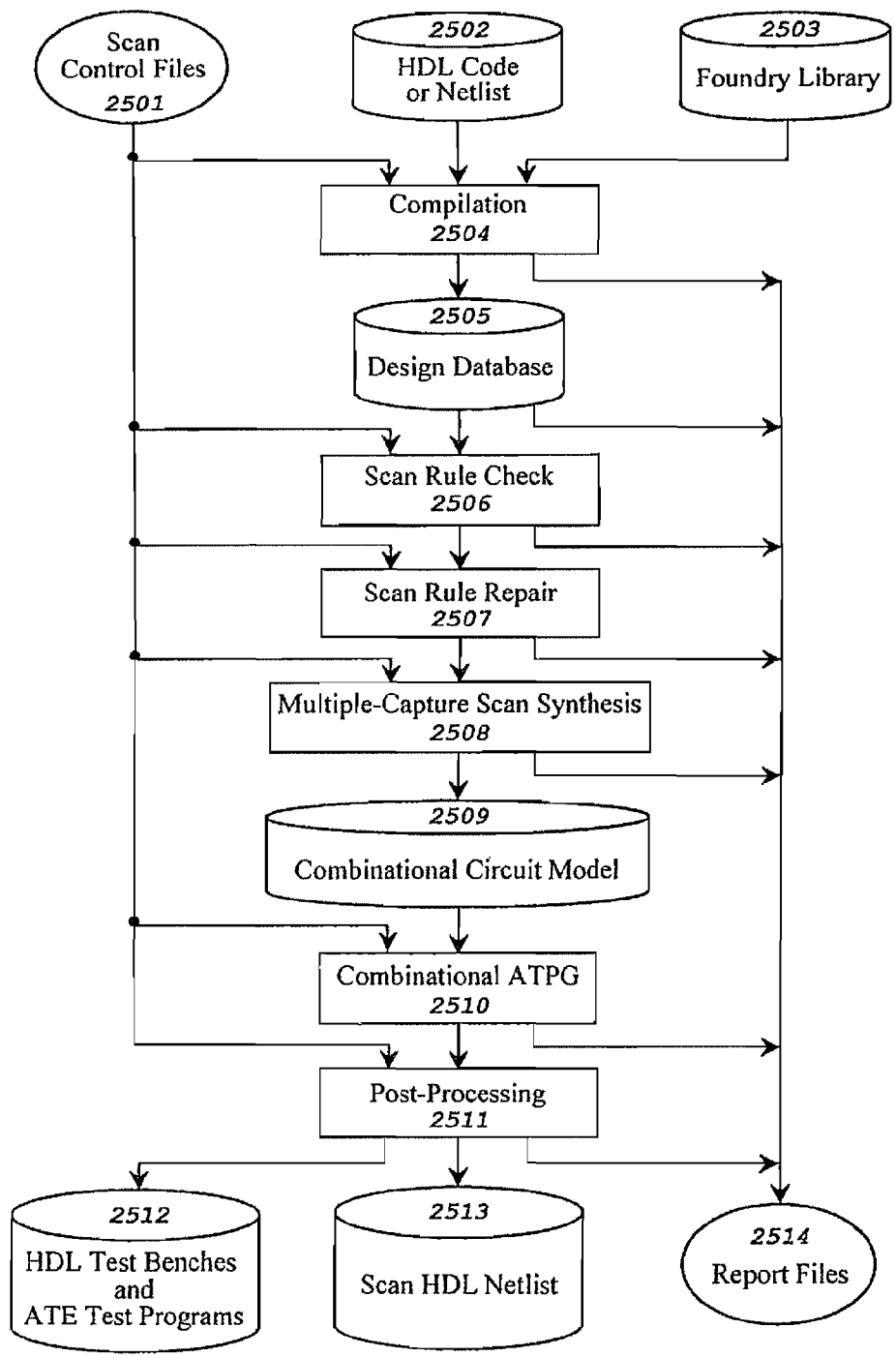
FIG. 25 shows a multiple-capture CAD system in accordance with the present invention, where a CAD system is used to implement the multiple-capture DFT technique on a full-scan or partial-scan design in scan-test mode.

FIG. 25 shows a flow chart of one embodiment of the invention. The multiple-capture scan-test computer-aided design (CAD) system 2500 accepts the user-supplied HDL code or netlist 2502 together with the scan control files 2501 and the chosen foundry library 2503. The scan control files 2501 contain all set-up information and scripts required for compilation 2504, scan rule check 2506, scan rule repair 2507, and multiple-capture scan synthesis 2508. As a result, an equivalent combinational circuit model 2509 is generated. Then, combinational ATPG 2510 can be performed. Finally, post-processing 2511 is used to produce the final scan HDL netlist 2512 as well as the HDL test benches and ATE test programs 2513. All reports and errors are saved in the report files 2514.

Figure 26:
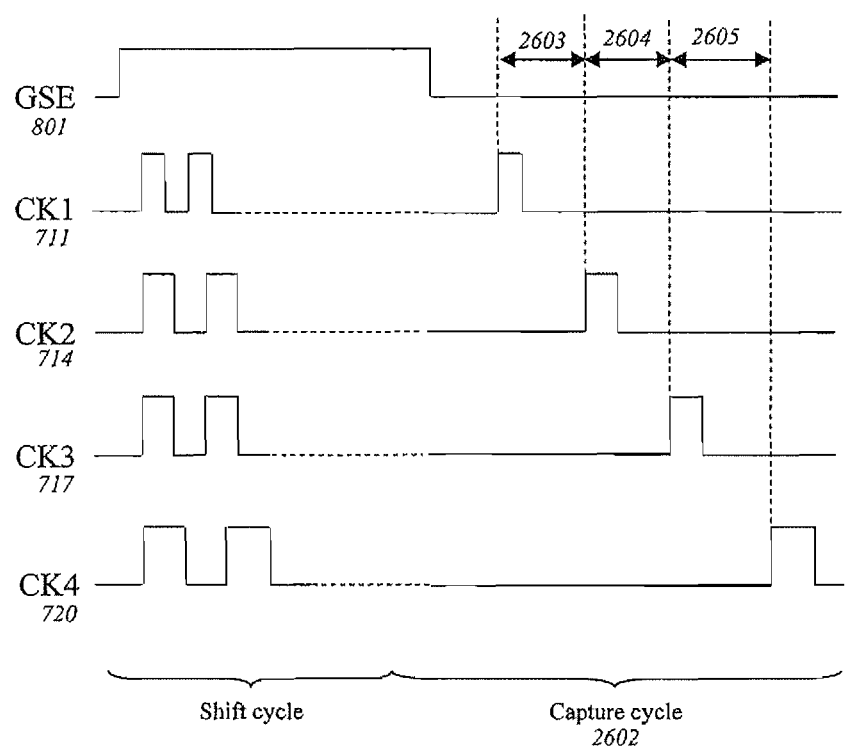
FIG. 26 shows a timing diagram of the full-scan design given in FIG. 7, in accordance with the present invention, where all capture clocks are programmed to operate in staggered single-capture mode to reduce peak capture power in self-test or scan-test mode.

FIG. 26 shows a timing diagram of the full-scan design given in FIG. 7, in accordance with the present invention, where all capture clocks are programmed to operate in staggered single-capture mode to reduce peak capture power in self-test or scan-test mode.

During the capture cycle 2602, clocks CK1 711 to CK4 720 are programmed to each have only one capture clock pulse. Clock pulses for clocks CK1 711 to CK4 720 are skewed by properly setting the delay 2603 between the capture pulses for the clocks CK1 711 and CK2 714, the delay 2604 between the capture pulses for the clocks CK2 714 and CK3 717, and the delay 2605 between the capture pulses for the clocks CK3 717 and CK4 720. As a result, yield loss caused by IR-drop from high peak capture power can be avoided.

Figure 27:
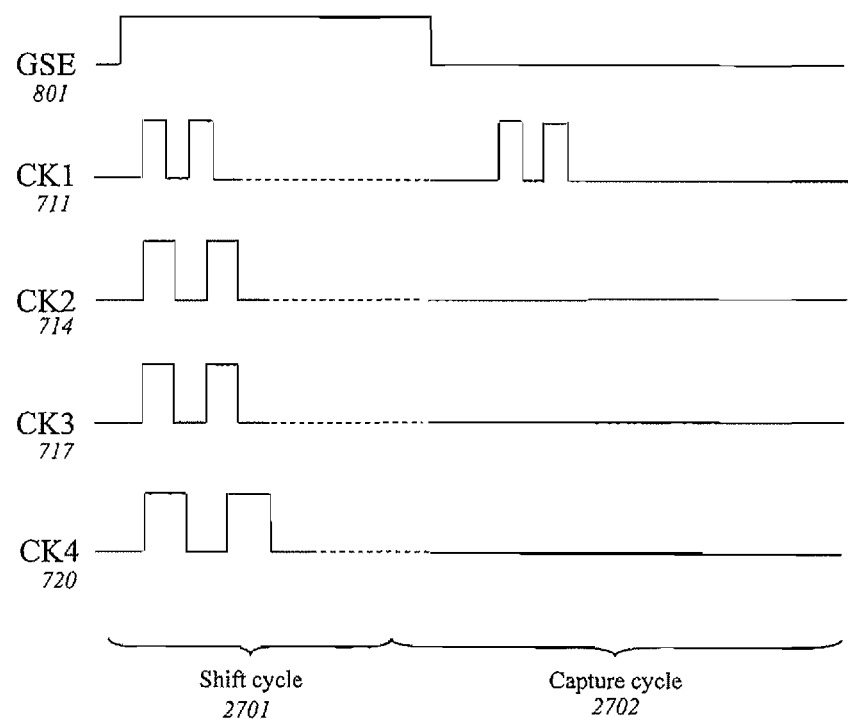
FIG. 27 shows a timing diagram of the full-scan design given in FIG. 7, in accordance with the present invention, where all capture clocks are programmed to operate in one-hot double-capture mode to reduce peak capture power in self-test or scan-test mode.

FIG. 27 shows a timing diagram of the full-scan design given in FIG. 7, in accordance with the present invention, where all capture clocks are programmed to operate in one-hot double-capture mode to reduce peak capture power in self-test or scan-test mode.

The figure shows an example of one-hot double-capture of clock CK1 711 where capture clock CK1 711 is held active that comprises two capture clock pulses, while the other three clocks CK2 714 to CK4 720 are held inactive. This means after stimuli are shifted into all scan cells in the shift cycle 2701, only the clock CK1 711 is programmed to capture in double-capture mode in the capture cycle 2702. Similarly, for one-hot double-capture of clocks CK2 714 to CK4 720, one of the clocks CK2 714 to CK4 720 are also programmed to be the only active capture clock while the others are silenced. With only one capture clock held active in one capture cycle, only scan cells in the active clock domain are allowed to capture the test response. As a result, yield loss caused by IR-drop from high peak capture power can be avoided.

Alternatively, each capture clock, CK1 711 to CK4 720, is programmable to comprise selectively only zero, one, two, or more than two capture clock pulses.

Figure 28:
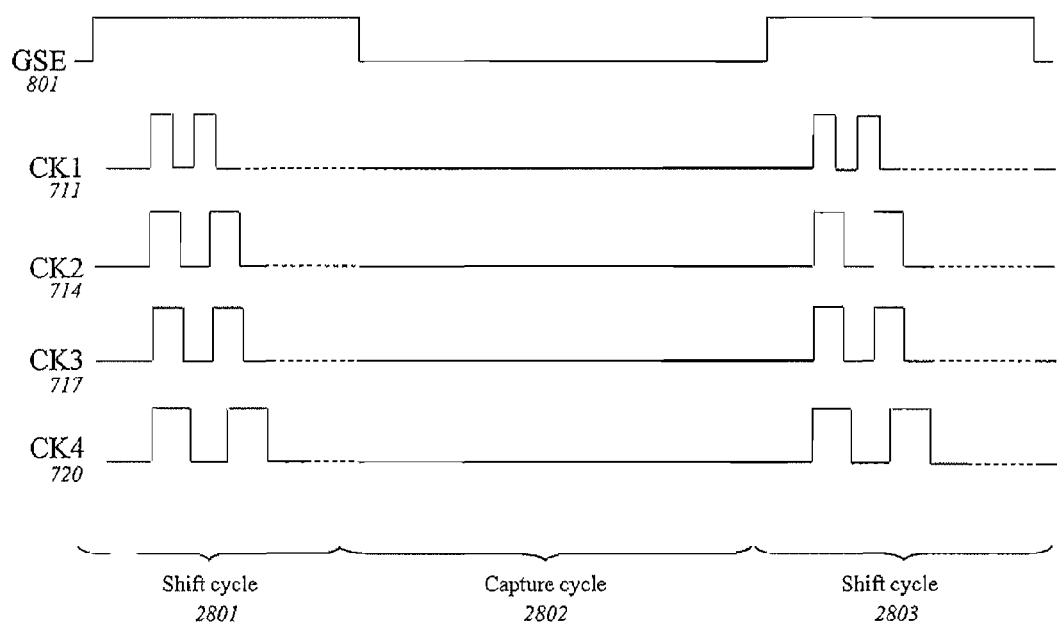
FIG. 28 shows a timing diagram of the full-scan design given in FIG. 7, in accordance with the present invention, where all capture clocks are programmed to be suppressed in self-test mode to check the integrity of the scan path and the proper operation of the logic BIST controller.

FIG. 28 shows a timing diagram of the full-scan design given in FIG. 7, in accordance with the present invention, where all capture clocks are programmed to be suppressed in self-test mode to check the integrity of the scan path and the proper operation of the logic BIST controller.

In the shift cycle 2801, stimuli generated by the PRPGs are shifted into all scan cells. In the capture cycle 2802, all clocks CK1 711 to CK4 720 are programmed to be suppressed. As a result, in the shift cycle 2803, logic values in all scan cells are directly shifted into MISRs in self-test mode for compaction without capture operation. An error in the signature produced by the MISRs would indicate faults in the scan chains or the PRPGs/MISRs. This provides an effective mechanism to check the integrity of the scan path and the proper operation of the logic BIST controller.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in the scope of the invention by the Claims appended hereto and their equivalents.

What is claimed is:

1. A computer-aided design (CAD) method for providing ordered capture clocks to detect or locate faults within N clock domains and faults crossing any two clock domains in an integrated circuit or circuit assembly in scan-test and self-test mode, where N>1, each clock domain having one capture clock and a plurality of scan cells, each capture clock comprising a selected number of shift clock pulses and a selected number of capture clock pulses, each shift clock pulse comprising a clock pulse applied in scan mode, each capture clock pulse comprising a clock pulse applied in normal mode, said CAD method comprising the computer-implemented steps of: (a) compiling the HDL code or netlist that represents said integrated circuit or circuit assembly in physical form into a design database; (b) performing multiple-capture test synthesis for generating a testable HDL code or netlist; and (c) generating HDL test benches and automatic test equipment (ATE) test programs for verifying the correctness of said testable HDL netlist in said scan-test or said self-test mode.

2. The CAD method of claim 1, wherein said steps of (a)-(c) accept user-supplied scan control information and report the results and errors, if any.

3. The CAD method of claim 1, wherein said performing multiple-capture test synthesis further comprises inserting spare scan cells into selected clock domains.

4. The CAD method of claim 1, wherein said performing multiple-capture test synthesis further comprises implementing the method of: (f) generating and shifting-in N test stimuli to all said scan cells within said N clock domains in said integrated circuit or circuit assembly during a shift-in operation; (g) applying an ordered sequence of capture clocks to all said scan cells within said N clock domains, the ordered sequence of capture clocks comprising at least a plurality of capture clock pulses from two or more selected capture clocks placed in a sequential order such that all clock domains are never triggered simultaneously during a capture operation; and (h) shifting-out said N output responses for analysis with said expected output responses, during a shift-out operation.

5. The CAD method of claim 1, wherein said generating HDL test benches and ATE test programs further comprises the steps of transforming said design database into an equivalent combinational circuit model based on said ordered sequence of capture clocks, performing combinational automatic test pattern generation (ATPG) to generate the circuit's test patterns, and performing fault simulation to report its fault coverage.

6. The CAD method of claim 1, wherein said generating HDL test benches and ATE test programs further comprises performing combinational logic simulation on said combinational circuit model to compute said circuit's signatures when a compact operation is employed to compact said circuit's output responses.

* * * * *